United States Patent
Jacobson et al.

(10) Patent No.: US 7,581,124 B1
(45) Date of Patent: Aug. 25, 2009

(54) METHOD AND MECHANISM FOR CONTROLLING POWER CONSUMPTION OF AN INTEGRATED CIRCUIT

(75) Inventors: Neil G. Jacobson, Los Altos, CA (US); Matthew T. Murphy, San Jose, CA (US); Tim Tuan, San Jose, CA (US); Kameswara K. Rao, San Jose, CA (US); Robert O. Conn, Laupahoehoe, HI (US)

(73) Assignee: XILINX, Inc., San Jose, CA (US)

( * ) Notice: Subject to any disclaimer, the term of this patent is extended or adjusted under 35 U.S.C. 154(b) by 424 days.

(21) Appl. No.: 11/326,542

(22) Filed: Jan. 4, 2006

Related U.S. Application Data

(63) Continuation-in-part of application No. 10/783,589, filed on Feb. 20, 2004, which is a continuation-in-part of application No. 10/666,669, filed on Sep. 19, 2003, now Pat. No. 7,098,689.

(51) Int. Cl.
*G06F 1/22* (2006.01)
(52) U.S. Cl. .................................. 713/310; 713/300
(58) Field of Classification Search ................. 713/300, 713/310
See application file for complete search history.

(56) References Cited

U.S. PATENT DOCUMENTS

| | | | |
|---|---|---|---|
| 4,962,341 A * | 10/1990 | Schoeff ..................... 326/43 |
| 5,303,390 A * | 4/1994 | Little ........................... 714/1 |
| 5,362,989 A | 11/1994 | Hennedy |
| 5,519,663 A | 5/1996 | Harper et al. |
| 5,568,062 A | 10/1996 | Kaplinsky |
| 5,583,457 A | 12/1996 | Horiguchi |
| 5,612,892 A | 3/1997 | Almulla |
| 5,615,162 A | 3/1997 | Houston |
| 5,671,149 A | 9/1997 | Brown |
| 5,682,107 A | 10/1997 | Tavana et al. |
| 5,712,790 A | 1/1998 | Ditlow |
| 5,801,548 A | 9/1998 | Lee et al. |
| 5,811,962 A | 9/1998 | Ceccherelli |
| 5,825,662 A | 10/1998 | Trimberger |
| 5,832,286 A | 11/1998 | Yoshida |
| 5,914,873 A | 6/1999 | Blish |
| 5,946,257 A | 8/1999 | Keeth |
| 5,958,026 A | 9/1999 | Goetting et al. |
| 6,038,386 A | 3/2000 | Jain |
| 6,114,843 A | 9/2000 | Olah |

(Continued)

OTHER PUBLICATIONS

U.S. Appl. No. 10/606,619, filed Jun. 26, 2003, New et al.

(Continued)

*Primary Examiner*—Tse Chen
(74) *Attorney, Agent, or Firm*—William L. Paradice, III; Kin-Wah Tong; Thomas George

(57) ABSTRACT

A PLD includes a plurality of logic blocks, a test circuit, and a test pin set. The logic blocks are coupled to gating circuits that selectively adjust an operating voltage for the blocks in response to control signals. During operation of the PLD, the control signals are updated in response to externally-generated signals provided to the PLD via the test pin set and routed to the logic blocks using the test circuit.

18 Claims, 11 Drawing Sheets

U.S. PATENT DOCUMENTS

| | | | |
|---|---|---|---|
| 6,148,390 | A | 11/2000 | MacArthur |
| 6,160,418 | A | 12/2000 | Burnham |
| 6,169,419 | B1 | 1/2001 | De et al. |
| 6,172,518 | B1 | 1/2001 | Jenkins, IV. et al. |
| 6,208,171 | B1 | 3/2001 | Kumagai et al. |
| 6,384,626 | B2 | 5/2002 | Tsai et al. |
| 6,466,049 | B1 | 10/2002 | Diba et al. |
| 6,489,804 | B1 | 12/2002 | Burr |
| 6,583,645 | B1 | 6/2003 | Bennett et al. |
| 6,631,502 | B2 | 10/2003 | Buffet et al. |
| 6,710,621 | B2 | 3/2004 | Farnworth |
| 6,711,719 | B2 | 3/2004 | Cohn et al. |
| 6,747,478 | B2 | 6/2004 | Madurawe |
| 6,839,888 | B2 | 1/2005 | Gupta |
| 6,885,563 | B2 | 4/2005 | Panella |
| 6,920,627 | B2 | 7/2005 | Blodget et al. |
| 6,936,917 | B2 | 8/2005 | Lopata et al. |
| 6,950,998 | B1 | 9/2005 | Tuan |
| 6,960,934 | B2 | 11/2005 | New |
| 7,003,620 | B2 | 2/2006 | Avraham et al. |
| 7,078,932 | B2 | 7/2006 | Swami |
| 7,080,341 | B2 | 7/2006 | Eisenstadt et al. |
| 7,098,689 | B1 | 8/2006 | Tuan et al. |
| 7,109,748 | B1 | 9/2006 | Liu et al. |
| 7,112,997 | B1 | 9/2006 | Liang et al. |
| 7,135,886 | B2 | 11/2006 | Schlacter |
| 7,170,315 | B2 | 1/2007 | Bakker et al. |
| 7,313,706 | B2 | 12/2007 | Williams et al. |
| 7,313,708 | B2 | 12/2007 | Oshins |
| 7,345,944 | B1 | 3/2008 | Jenkins |
| 2002/0053039 | A1* | 5/2002 | Inoue et al. ............... 713/323 |
| 2003/0030326 | A1 | 2/2003 | Shenai et al. |
| 2003/0218478 | A1 | 11/2003 | Sani et al. |
| 2004/0145955 | A1 | 7/2004 | Mizuno et al. |
| 2005/0091547 | A1 | 4/2005 | Hanrieder et al. |
| 2005/0201174 | A1 | 9/2005 | Klein |
| 2006/0053246 | A1 | 3/2006 | Lee |
| 2006/0069851 | A1 | 3/2006 | Chung et al. |
| 2006/0202713 | A1 | 9/2006 | Shumarayev |
| 2007/0001720 | A1 | 1/2007 | Li et al. |
| 2007/0164785 | A1 | 7/2007 | He |

OTHER PUBLICATIONS

U.S. Appl. No. 10/666,669, filed Sep. 19, 2003, Tuan et al.

U.S. Appl. No. 10/783,589, filed Feb. 20, 2004, Look et al.

U.S. Appl. No. 10/377,857, filed Feb. 28, 2003, Blodget et al.

U.S. Appl. No. 10/783,216, filed Feb. 20, 2004, Tuan et al.

Mutoh Shin'ichiro et al. "1-V Power Supply High-speed Digital Circuit Technology with Multithreshold-Voltage CMOS", IEEE Journal Of Solid-state Circuits, Aug. 1995, pp. 847-854, vol. 30, No. 8, available from IEEE, 3 Park Avenue, 17th Floor, New York, NY 10016-5997.

Inukai, T. et al., "Boosted Gate MOS (BGMOS): Device/Circuit Cooperation Scheme to Achieve Leakage-Free Giga-Scale Integration" IEEE 2000 Custom Integrated Circuits Conference, pp. 409-412, available from IEEE, 3 Park Avenue, 17th Floor, New York, NY 10016-5997.

Kuroda, Tadahiro et al., "A 0.9-V, 150-MHz, 10-mW, 4 mm$^2$, 2-D Discrete Cosine Transform Core Processor With Variable Threshold-Voltage (VT) Scheme", Nov. 1996, pp. 1770-1779, vol. 32, No. 11, available from IEEE, 3 Park Avenue, 17th Floor, New York, NY 10016-5997.

Hamzaoglu, Fatih et al., "Circuit-Level Techniques to Control Gate Leakage for Sub-100nm CMOS", ISLPED, Aug. 12-14, 2002, pp. 60-63, available from IEEE, 3 Park Avenue, 17th Floor, New York, NY 10016-5997.

He, Lei; "Power Efficient FPGA: Circuit, Fabrics and CAD Algorithms," Presentation of Feb. 13, 2004, 50 pages, at Xilinx, Inc. 2100 Logic Drive, San Jose, CA 95124, available from EE Department, UCLA, at http://eda.ee.ucla.edu/.

FPGA 2004 Advance Program; ACM/SIGDA Eleventh international Symposium on Field Programmable Gate Arrays, Feb. 22-24, 2004, 6 pages, at Monterey Beach Hotel, Monterey, California, available at http://fpga2004.ece.ubc.ca/.

Takahashi, M. et al.; "A 60-mW MPEG4 Video Codec Using Clustered Voltage Scaling with Variable Supply-Voltage Scheme," Nov. 1998, pp. 1772-1780, vol. 33, No. 11, available from IEEE Journal of Solid-State Circuits, IEEE, 3 Park Avenue, 17th Floor, New York, NY 10016-5997.

Jae Y. Park, Mark G. Allen; "A Comparison of Micromachined Inductors with Different Magnetic Core Materials"; 1996 Electronic Components and Technology Conference; 1996 IEEE; pp. 375-381.

Thomas D. Burd et al.; "A Dynamic Voltage Scaled Microprocessor System"; 2000 IEEE; IEEE Journal of Solid-State Circuits, vol. 35, No. 11, Nov. 2000; pp; 1571-1580.

Anthony J. Stratakos et al.; "A Low-Voltage CMOS DC-DC Converter for a Portable Battery-Operated System"; 1994 IEEE; pp. 619-626.

Anthony John Stratakos; "High-Efficiency Low-Voltage DC-DC Conversion for Portable Applications," Chapter 3;l "DC-DC Converter Fundamentals"; pp. 42-78.

Allen/Holberg, Chapter 10; "Bandgap Voltage Reference"; Apr. 12, 2000; downloaded on Jan. 3, 2006 from www.ece.utexas.edu/~holberg/lecture_notes/bandgap.pdf; pp. 1-5.

Intel Corporation, "Intel PXA27x Processor Family Power Requirements", Application Note, 2004, pp. 1-36, available from Intel Corporation (Santa Clara) Corporate Office, 2200 Mission College Blvd., Santa Clara, California 95052-8119.

Microchip Technology Inc.; "Micropower Voltage Supervisors"; MCP102/103/121/131; Copyright 2005; downloaded on Jan. 3, 2006 from ww1.microchip.com/downloads/en/DeviceDoc/21906b.pdf; pp. 1-28.

Nowka, Kevin J., A 32-bit PowerPC System-on-a-Chip With Support For Dynamic Voltage Scaling and Dynamic Frequency Scaling, Nov. 2002, pp. 1441-1447, vol. 37, No. 11, IEEE Journal of Solid-State Circuits, Available from IEEE; 3 Park Avenue, 17th Floor, New York, NY 10016-5997.

Texas Instruments—Datasheet BQ4011 (32x8 nonvolatile SRAM) May 1999 pp. 1-15.

Texas Instruments (BenchMARq)—Datasheet BQ4011 (32x8 nonvolatile SRAM) Aug. 1993 pp. 1-11.

Xilinx, Inc., "Spartan-3L Low Power FPGA Family", Preliminary Product Specification, DS313, Sep. 15, 2005, v1.1, pp. 1-10, available from Xilinx, Inc., 2100 Logic Drive, San Jose, CA 95124.-3L.

Xilinx, Inc., "Virtex-II Pro Platform FPGA Handbook"; published Oct. 14, 2002; available from Xilinx, Inc., 2100 Logic Drive, San Jose, CA 95124; pp. 19-71.

U.S. Appl. No. 11/502,939, filed Aug. 11, 2006, Tuan, Tim, et al., entitled "Disabled Unused/Inactive Resources in Programmable Logic Devices for Static Power Reduction", Xilinx, Inc., San Jose, CA 95124.

U.S. Appl. No. 11/329,646, filed Jan. 11, 2006, Jenkins, Jesse H. IV, entitled "Programmable Detection of Power Failure in an Integrated Circuit", Xilinx, Inc., San Jose, CA.

U.S. Appl. No. 11/325,888, filed Jan. 4, 2006, Tuan, Tim, entitled "Programmable Low Power Modes For Embedded Memory Blocks", Xilinx, Inc., San Jose, CA.

U.S. Appl. No. 11/268,265, filed Nov. 4, 2005, Rahman, Arifur, et al. entitled "Implementation of Low Power Standby Modes For Integrated Circuits", Xilinx, Inc., San Jose, Ca.

U.S. Appl. No. 10/971,934, filed Oct. 22, 2004, Jenkins, Jesse H. IV, entitled "Low Power Zones For Programmable Logic Devices", Xilinx, Inc., San Jose, CA 95124.

U.S. Appl. No. 10/783,589, filed Feb. 20, 2004, Look, Kevin T., et al., entitled "Regulating Unused/Inactive Resources in Programmable Logic Devices for Static Power Reduction", Xilinx, Inc., San Jose, CA 95124.

U.S. Appl. No. 10/783,216, filed Feb. 20, 2004, Tuan, Tim et al., entitled "Tuning Programmable Logic Devices for Low-Power Design Implementation", Xilinx, Inc., San Jose, CA 95124.

US 6,981,160, 12/2005, Thaker et al. (withdrawn)

* cited by examiner

US 7,581,124 B1

METHOD AND MECHANISM FOR CONTROLLING POWER CONSUMPTION OF AN INTEGRATED CIRCUIT

RELATED APPLICATIONS

The present application is a continuation-in-part of U.S. patent application Ser. No. 10/783,589 entitled "Regulating Unused/Inactive Resources in Programmable Logic Devices for Static Power Reduction" and filed on Feb. 20, 2004, which is a continuation-in-part of U.S. patent application Ser. No. 10/666,669 entitled "Disabling Unused/Inactive Resources in Programmable Logic Devices for Static Power Reduction" and filed on Sep. 19, 2003, both of which are incorporated by reference herein in their entireties.

FIELD OF THE INVENTION

The present invention relates to the regulation of the supply voltage provided to unused and/or inactive blocks in an integrated circuit (IC) device to achieve lower static power consumption. More specifically, the present invention relates to selectively reducing the operating voltage of various blocks of the IC device to reduce the leakage current and/or increase the performance of the device.

BACKGROUND

Improved performance in integrated circuits requires technology scaling. As technology is scaled, the physical dimensions of transistors, such as gate oxide thickness and transistor gate length, are reduced. The operating voltage of the transistor must scale to maintain an acceptable electric field across the gate oxide to maintain acceptable reliability. Lowering the operating voltage requires that the threshold voltage of the transistor be reduced. Transistor off-state leakage current consists of sub-threshold leakage, gate direct tunnel current, and band-to-band tunnel leakage current. The relationship of transistor off-state leakage currents with respect to device scaling is shown by Inukai, et al., in "Boosted Gate MOS (BGMOS): Device/Circuit Cooperation Scheme to Achieve Leakage-Free Giga-Scale Integration", IEEE Custom Integrated Circuit Conference, 19-2-1, 2000.

Inukai et al. teach that the sub-threshold leakage of the transistor becomes increasing large from one technology node to the next technology. At the same time, the gate leakage current of the transistor also increases as a result of reduction in gate oxide thickness. It has been reported that the gate leakage current increases by an order of magnitude for each 2 Angstrom reduction in gate oxide thickness. (Hamzaoglu et al., "Circuit-Level Techniques to Control Gate Leakage for sub-100 nm CMOS", ISLPED. p. 60-63, August, 2002.) Inukai et al. project that the gate leakage current will exceed the sub-threshold leakage current and become the dominating factor in leakage at some technology node. Therefore, standby power becomes more and more problematic in technology scaling.

Circuit techniques to suppress leakage currents have been proposed in the literature. Kuroda et al. propose a VTMOS technique to suppress standby leakage current in "0.9V. 150-MHz, 10-mW, 4 mm$^2$, 2-D discrete cosine transform core processor with variable threshold-voltage (VT) scheme", IEEE Journal of Solid-State Circuits, vol. 31. pp. 1770-1779, 1996. In this VTMOS technique, the transistor is back-biased to raise the threshold voltage of the transistor in a standby mode. This technique can reduce the transistor sub-threshold leakage current, but does not reduce the gate tunneling leakage current.

Mutoh et al. propose an MTMOS technique in "I-V Power Supply High-Speed Digital Circuit Technology With Multi-Threshold Voltage CMOS", IEEE Journal of Solid-State Circuit, vol. 30, pp. 847-854, 1995. This MTMOS technique uses a transistor having a high threshold voltage (Vt) to supply a virtual VDD supply voltage and a ground supply voltage to core circuitry. The high Vt transistor has the same gate oxide thickness as transistors in the core circuitry, but is less leaky. However, the MTMOS technique faces a similar problem as the VTMOS technique. That is, the MTMOS technique does not reduce gate leakage current.

Inukai et al. propose a BGMOS technique. The BGMOS technique uses a thicker oxide transistor as a power switch to shut-off the leakage path in a standby mode. However, the disadvantage of this technique is that the stored data are lost in standby mode. Inukai et al. propose adding a memory cell to store the data in standby mode. However, this proposed solution results in a significant increase in area penalty.

It would therefore be desirable to have a technique that can reduce both the gate tunneling leakage and sub-threshold leakage while maintaining the circuit state without significantly increasing the area penalty for the upcoming technology node.

Note that programmable logic devices (PLDs), such as field programmable gate arrays (FPGAs), have a significantly higher static power consumption than dedicated logic devices, such as standard-cell application specific integrated circuits (ASICs). A reason for this high static power consumption is that for any given design, a PLD only uses a subset of the available resources. The unused resources are necessary for providing greater mapping flexibility to the PLD. However, these unused resources still consume static power in the form of leakage current. Consequently, PLDs are generally not used in applications where low static power is required.

It would therefore be desirable to reduce the static power consumption of integrated circuit, such as PLDs.

SUMMARY

In accordance with one embodiment of the present invention, unused and/or inactive resources in a PLD are disabled to achieve lower static power consumption.

In accordance with embodiments of the present invention, each logic block of an integrated circuit (IC) device such as a PLD includes a first power terminal coupled to VDD by a first gating circuit, and includes a second power terminal coupled to ground potential by a second gating circuit. The gating circuits can be individually programmed to selectively provide a full operating voltage, a reduced operating voltage, or a negligible operating voltage to corresponding programmable logic blocks. For some embodiments, control signals for controlling the gating circuits can be stored in corresponding storage elements of a memory circuit that is accessible using test circuitry provided on the PLD. For example, the PLD can include a JTAG-compliant test circuit having a boundary scan architecture coupled to the memory circuit and having an interface coupled to existing test pins of the PLD. The control signals may be generated external to the PLD (e.g., in response to observed operating conditions of the PLD), and during run time may be provided to the PLD via the test pins and stored in corresponding storage elements of the memory circuit using the boundary scan architecture. Thereafter, the boundary scan architecture may be used to route the control signals from the memory circuit to the programmable logic blocks. In this manner, the operating voltage provided to each programmable logic block may be dynamically adjusted in response to externally-generated control signals provided to the PLD via existing test pins, thereby allowing the PLD's non-test pins to be used for implementing a desired user design.

The present invention will be more fully understood in view of the following description and drawings.

BRIEF DESCRIPTION OF THE DRAWINGS

Like reference numerals refer to corresponding parts throughout the drawing figures.

DETAILED DESCRIPTION

In accordance with one embodiment of the present invention, inactive resources and unused resources in an integrated circuit (IC) device such as a programmable logic device (PLD) may be selectively disabled to reduce static power consumption by selectively adjusting the operating voltage provided to such resources. The present invention includes both an enabling software flow and an enabling hardware architecture, which are described in more detail below. Unused resources of the PLD can be disabled when designing a particular circuit to be implemented by the PLD (hereinafter referred to as "design time"). In addition, resources of the PLD that are temporarily inactive can be disabled during operation of the PLD (hereinafter referred to as "run time").

Embodiments of the present invention are described below in the context of a PLD for simplicity only. It is to be understood that present embodiments are equally applicable to other IC devices such as application-specific integrated circuit (ASIC) devices. In the following description, for purposes of explanation, specific nomenclature is set forth to provide a thorough understanding of the present invention. In other instances, well-known circuits and devices are shown in block diagram form to avoid obscuring the present invention unnecessarily. Further, the logic states of various signals described herein are exemplary and therefore may be reversed or otherwise modified as generally known in the art. Additionally, the interconnection between circuit elements or blocks may be shown as buses or as single signal lines. Each of the buses may alternatively be a single signal line, and each of the single signal lines may alternatively be a bus. Accordingly, the present invention is not to be construed as limited to specific examples described herein but rather includes within its scope all embodiments defined by the appended claims.

Figure 1:
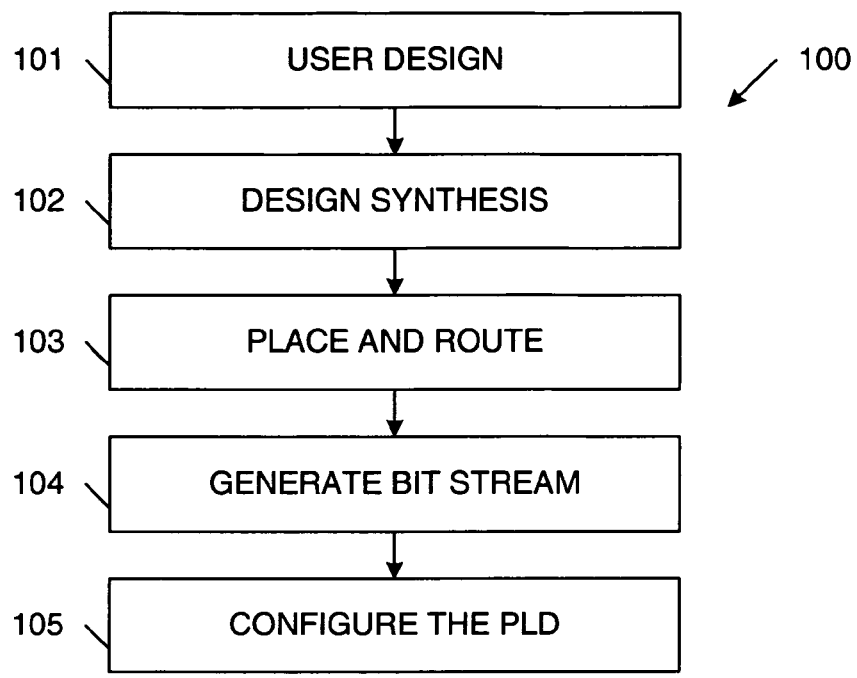
FIG. 1 is a flow diagram illustrating a conventional design flow used for PLDs.

FIG. 1 is a flow diagram 100 illustrating a conventional design flow used for PLDs. Initially, a user designs a circuit to be implemented by the PLD (Step 101). This user design is described in a high-level specification, such as Verilog or VHDL. The high-level specification is first synthesized to basic logic cells available on the PLD (Step 102). A place and route process then assigns every logic cell and wire in the design to some physical resource in the PLD (Step 103). The design is then converted into a configuration bitstream, in a manner known to those of ordinary skill in the art (Step 104). The configuration bit stream is then used to configure the device by setting various on-chip configuration memory cells (Step 105). While modern design flows may be much more complex, they all involve the basic steps defined by flow diagram 100.

In accordance with the present invention, unused resources of the PLD are identified during the design time, following the place and route process (Step 103). These unused resources are then selectively disabled during the design time. As described below, there are several ways to disable the unused resources. By selectively disabling the unused resources at design time, significant static power reduction may be achieved with no performance penalty.

Figure 2:
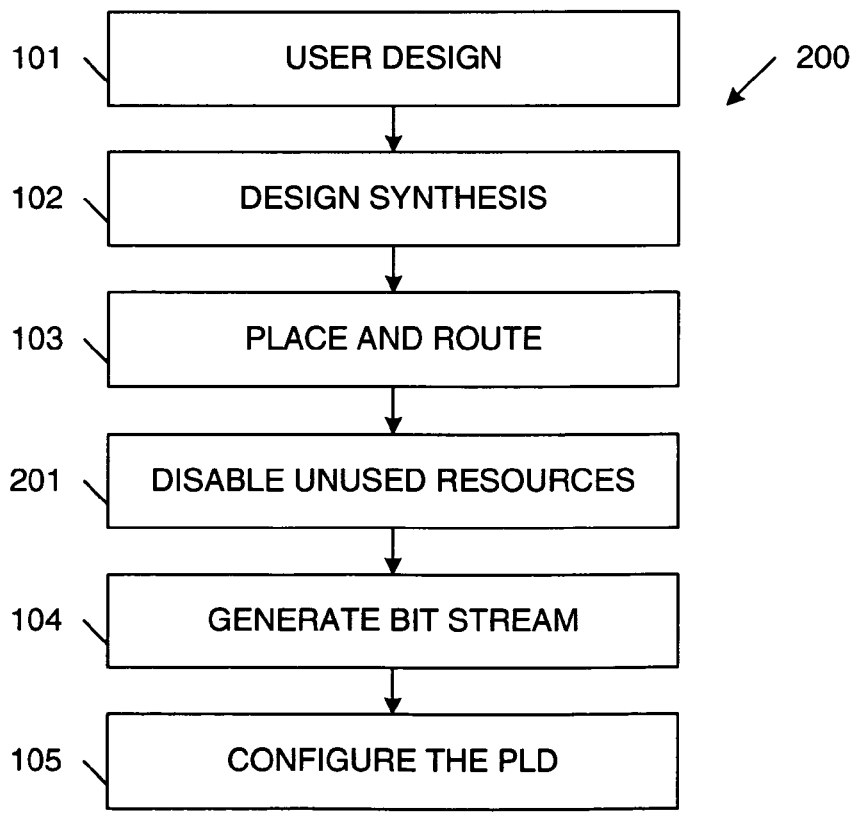
FIG. 2 is a flow diagram illustrating a design flow for a PLD in accordance with one embodiment of the present invention.

FIG. 2 is a flow diagram 200 illustrating a design flow in accordance with one embodiment of the present invention. Similar steps in flow diagrams 100 and 200 are labeled with similar reference numbers. Thus, flow diagram 200 includes Steps 101-105 of flow diagram 100, which are described above. In addition, flow diagram 200 includes the step of disabling unused resources in the PLD (Step 201). This step of disabling unused resources is performed after the place and route process has been completed in Step 103, and before the configuration bit stream is generated in Step 104. As described in more detail below, the unused resources are disabled by disabling predetermined programmable logic blocks of the PLD.

In another embodiment, further power savings are obtained by disabling temporarily inactive resources of the configured PLD during run time. Often, the entire design or parts of the design are temporarily inactive for some period of time. If the inactive period is sufficiently long, it is worthwhile to disable the inactive resources to reduce static power consumption. In a preferred embodiment, the decision of when to disable a temporarily inactive resource is made by the designer. In this embodiment, the user logic is provided access to a disabling mechanism, which enables the inactive resources to be disabled dynamically.

There are a number of techniques to disable resources in a PLD. In accordance with one embodiment, the PLD is logically subdivided into a plurality of separate programmable logic blocks. As described below, each programmable logic block may comprise one or more of the resources available on the programmable logic device. Switch elements are used to couple each of the programmable logic blocks to one or more associated voltage supply terminals (e.g., VDD or ground potential). The switch elements are controlled to perform a power-gating function, wherein unused and/or inactive programmable logic blocks are disabled (e.g., prevented from receiving power or receiving a reduced power). Preferably, only one of the voltage supply terminals (VDD or ground potential) is power-gated, thereby reducing the speed and area penalties associated with the switch elements. When the switch elements are controlled to de-couple the associated programmable logic blocks from the associated supply voltage, these programmable logic blocks are effectively disabled, thereby dramatically reducing the static power consumption of these blocks.

Figure 3:
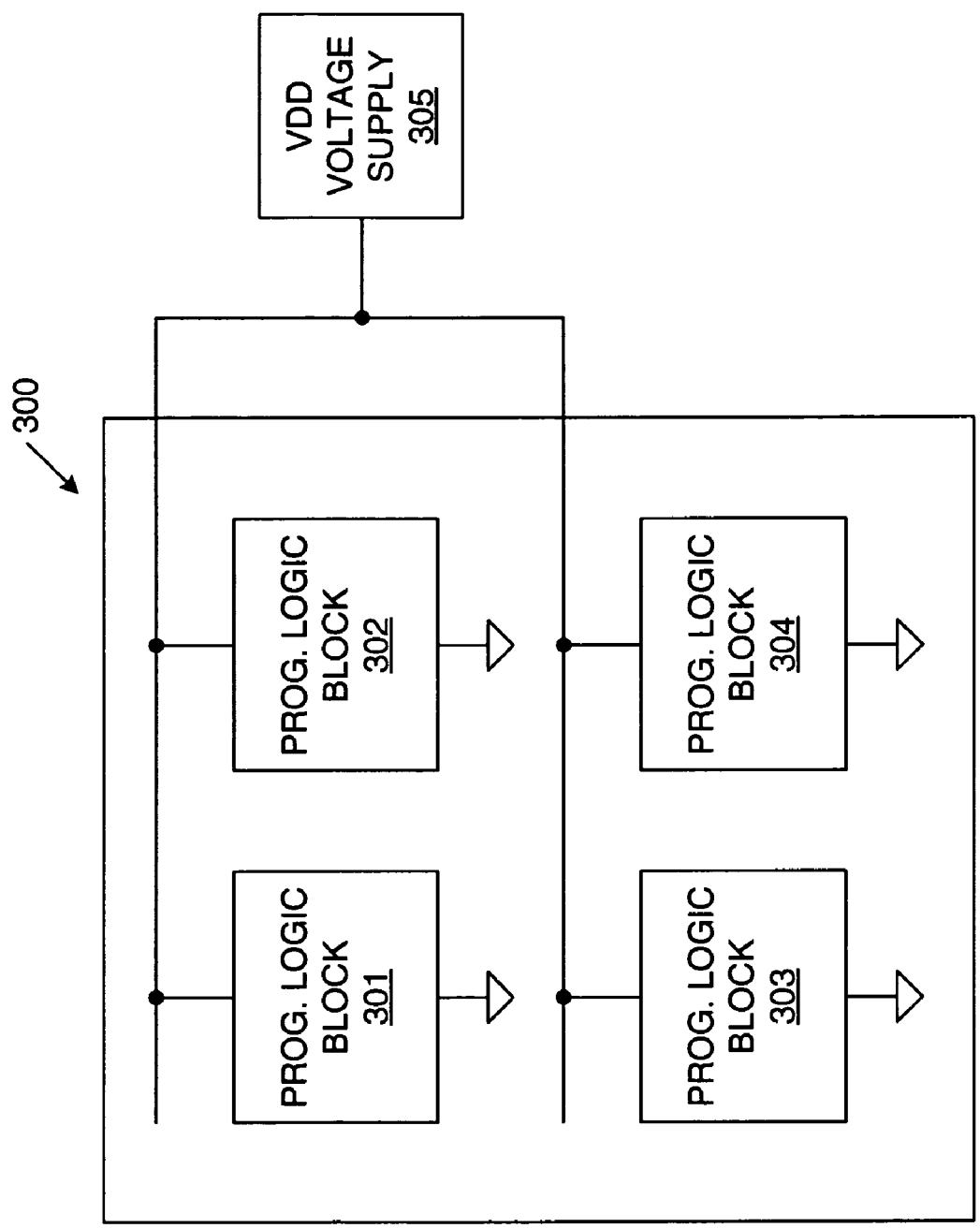
FIG. 3 is a block diagram of a conventional PLD having four blocks, which are all powered by the same off-chip VDD voltage supply.

FIG. 3 is a block diagram of a conventional PLD 300 having four programmable logic blocks 301-304, which are all powered by the same off-chip VDD voltage supply 305. Note that all four programmable logic blocks 301-304 are coupled to receive the VDD supply voltage during normal operating conditions, even if some of these blocks are not used in the circuit design.

Figure 4:
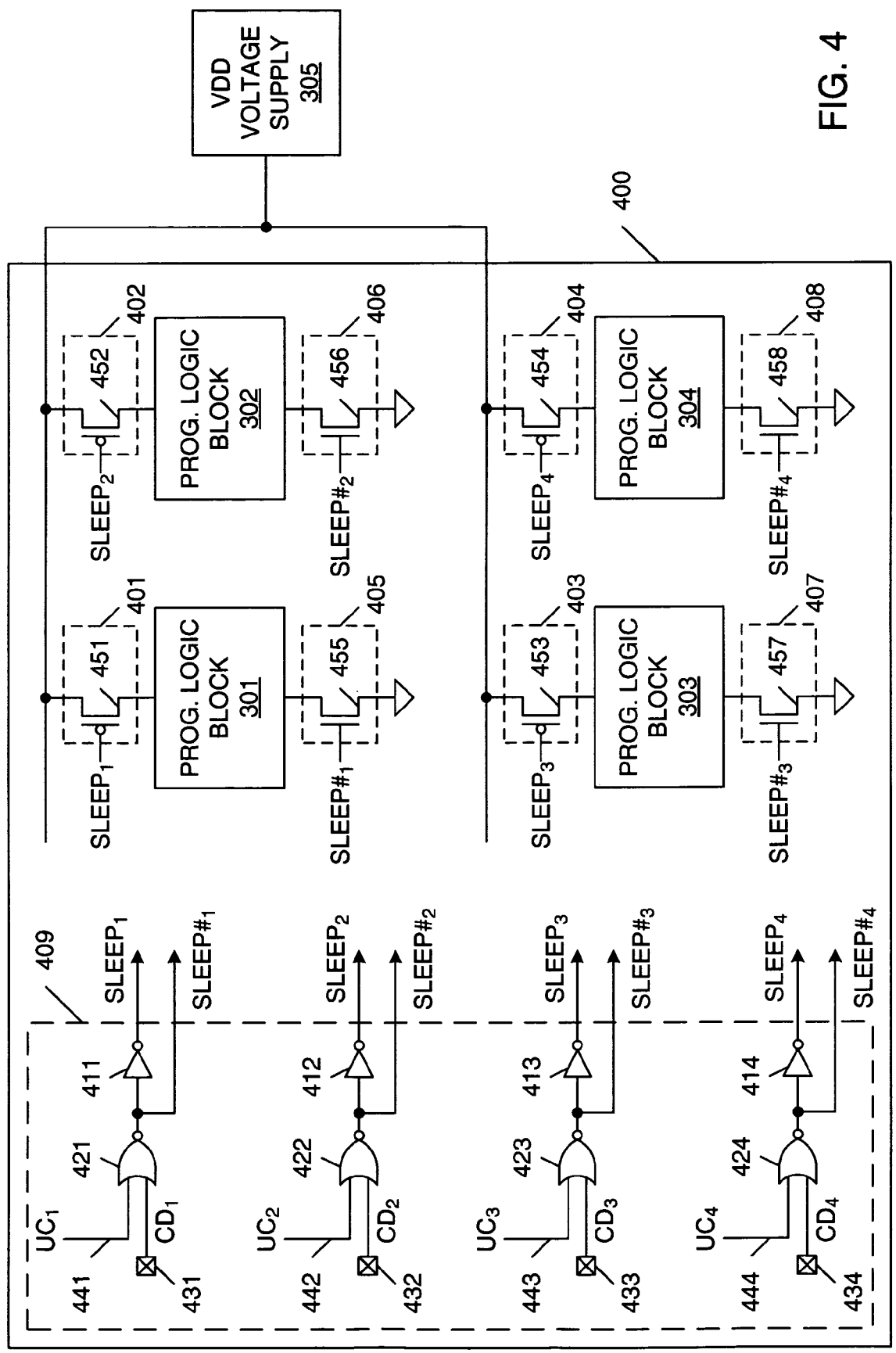
FIG. 4 is a block diagram of a PLD that implements power-gating switch elements in accordance with one embodiment of the present invention.

FIG. 4 is a block diagram of a PLD 400 in accordance with one embodiment of the present invention. Similar elements in FIGS. 3 and 4 are labeled with similar reference numbers. Thus, PLD 400 includes programmable logic blocks 301-304 and VDD voltage supply 305. In addition, PLD 400 includes switch elements 401-408, and control circuit 409. In the described embodiment, switch elements 401-404 are implemented by PMOS power-gating transistors 451-454, respectively, and switch elements 405-408 are implemented by NMOS power-gating transistors 455-458, respectively. In other embodiments, switch elements 401-408 may be any switch known to those ordinarily skilled in the art. Control circuit 409 is implemented by inverters 411-414, NOR gates 421-424, configuration memory cells 431-434, and user logic input terminals 441-444.

NOR gates 421-424 and inverters 411-414 are configured to generate power-gating control signals $SLEEP_1$—$SLEEP_4$ and $SLEEP\#_1$-$SLEEP\#_4$ in response to the configuration data values $CD_1$-$CD_4$ stored in configuration memory cells 431-434, respectively, and the user control signals $UC_1$-$UC_4$ provided on user logic input terminals 441-444, respectively.

For example, NOR gate 421 is coupled to receive configuration data value $CD_1$ from configuration memory cell 431 and user control signal $UC_1$ from user logic input terminal 441. If either the configuration data value $CD_1$ or the user control signal $UC_1$ is activated to a logic high state, then NOR gate 421 provides an output signal ($SLEEP\#_1$) having a logic "0" state. In response, inverter 411, which is coupled to the output terminal of NOR gate 421, provides an output signal ($SLEEP_1$) having a logic "1" state.

The $SLEEP_1$ signal is applied to the gate of PMOS power-gating transistor 451, which is coupled between block 301 and the VDD voltage supply terminal. The $SLEEP\#_1$ signal is applied to the gate of NMOS power-gating transistor 455, which is coupled between block 301 and the ground voltage supply terminal. The logic "0" state of the $SLEEP\#_1$ signal causes NMOS power-gating transistor 455 to turn off, thereby de-coupling block 301 from the ground supply voltage terminal. Similarly, the logic "1" state of the $SLEEP_1$ signal causes PMOS power-gating transistor 451 to turn off, thereby de-coupling block 301 from the VDD supply voltage terminal. De-coupling block 301 from the VDD and ground supply voltage terminals effectively disables block 301, thereby minimizing the static leakage current in this block.

If both the configuration data value $CD_1$ and the user control signal $UC_1$ are de-activated to a logic low state, then NOR gate 421 provides a $SLEEP\#_1$ signal having a logic "1" state, and inverter 411 provides a $SLEEP_1$ signal having a logic "0" state. The logic "1" state of the $SLEEP\#_1$ signal causes NMOS power-gating transistor 455 to turn on, thereby coupling block 301 to the ground supply voltage terminal. Similarly, the logic "0" state of the $SLEEP_1$ signal causes PMOS power-gating transistor 451 to turn on, thereby coupling block 301 to the VDD supply voltage terminal. Coupling block 301 to the VDD and ground supply voltage terminals effectively enables block 301.

Programmable logic block 302 may be enabled and disabled in response to configuration data value $CD_2$ and user control signal $UC_2$, in the same manner as block 301. Similarly, programmable logic block 303 may be enabled and disabled in response to configuration data value $CD_3$ and user control signal $UC_3$, in the same manner as block 301. Programmable logic block 304 may be enabled and disabled in response to configuration data value $CD_4$ and user control signal $UC_4$, in the same manner as block 301.

As described above, when a programmable logic block is used and active, the associated power-gating transistors are turned on. Conversely, when a programmable logic block is unused or inactive, the associated power gating transistors are turned off. The $SLEEP_1$-$SLEEP_4$ and $SLEEP\#_1$-$SLEEP\#_4$ signals can be controlled by the configuration data values $CD_1$-$CD_4$ stored by configuration memory cells 431-434, which are best suited for disabling the associated blocks at design time. If a block is not disabled at design time, this block can be disabled at run time by the user control signals $UC_1$-$UC_4$, which may be generated by the user logic, or by other means.

In accordance with another embodiment of the present invention, some blocks have multiple supply voltages. In this case all of the supply rails should be power-gated to achieve maximum power reduction. In accordance with another embodiment, only one switch element may be associated with each block. That is, the blocks are power-gated by de-coupling the block from only one power supply terminal, and not both the VDD and ground supply voltage terminals, thereby conserving layout area.

The granularity of the power-gated programmable logic blocks can range from arbitrarily small circuits to significant portions of the PLD. The decision concerning the size of each programmable logic block is made by determining the desired trade-off between power savings, layout area overhead of the switch elements and the control circuit, and speed penalty. In a FPGA, each programmable logic block may be selected to include one or more configuration logic blocks (CLBs), input/output blocks (IOBs), and/or other resources of the FPGA (such as block RAM, processors, multipliers, adders, transceivers).

Another way to disable a programmable logic block is by scaling down the local supply voltage to the block as low as possible, which dramatically reduces the power consumption, both static and dynamic, of the block. To scale down the local supply voltage in this manner, each independently controlled programmable logic block is powered by a separate switching regulator.

Figure 5:
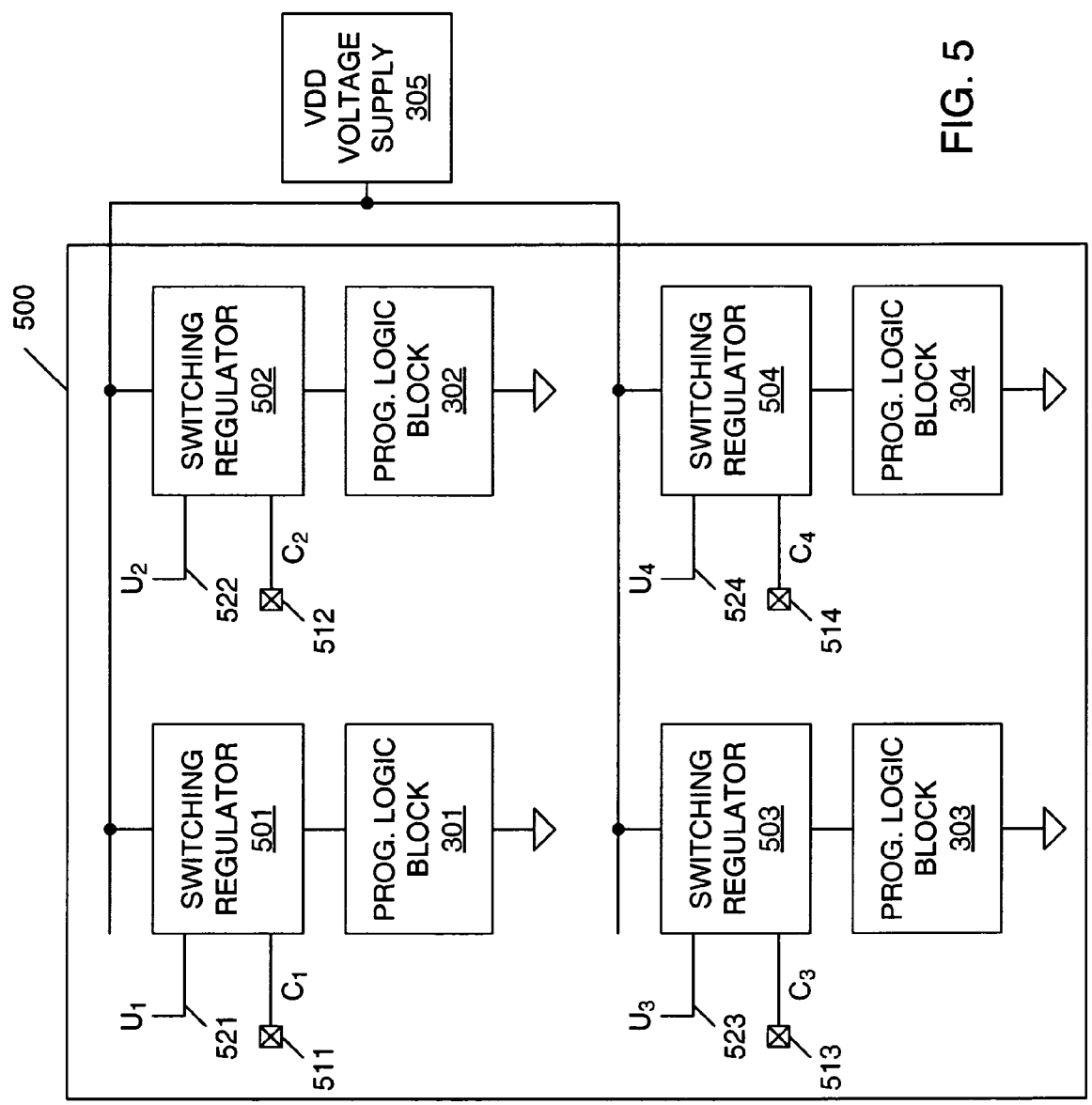
FIG. 5 is a block diagram of a PLD that implements switching regulators in accordance with some embodiments of the present invention.

FIG. 5 is a block diagram of a PLD 500 that implements switching regulators in accordance with one embodiment of the present invention. Similar elements in FIGS. 3 and 5 are labeled with similar reference numbers. Thus, PLD 500 includes programmable logic blocks 301-304 and VDD voltage supply 305. In addition, PLD 500 includes switching regulators 501-504, which are coupled between blocks 301-

304, respectively, and VDD voltage supply 305. Switching regulators 501-504 are controlled by control circuits 511-514, respectively. In the described embodiment, switching regulators 501-504 reside on the same chip as blocks 301-304. However, in other embodiments, these switching regulators can be located external to the chip containing blocks 301-304. Switching regulators 501-504 can be programmably tuned to provide the desired supply voltages to the associated programmable logic blocks 301-304. For example, switching regulator 501 can provide a full VDD supply voltage to programmable logic block 301 when this block is used and active. However, switching regulator 501 can further be controlled to provide a reduced voltage (e.g., some percentage of the VDD supply voltage) to programmable logic block 301 when this block is unused or inactive. This reduced voltage may be predetermined (by design or via testing) depending on the desired circuit behavior. For example, this reduced voltage may be the minimum voltage required to maintain the state of the associated blocks. The power consumption of block 301 is significantly reduced when the supplied voltage is reduced in this manner.

Switching regulators 501-504 are controlled in response to the configuration data values $C_1$-$C_4$ stored in configuration memory cells 511-514, respectively, and the user control signals $U_1$-$U_4$ provided on user control terminals 521-524, respectively. A configuration data value (e.g., $C_1$) having an activated state will cause the associated switching regulator (e.g., switching regulator 501) to provide a reduced voltage to the associated programmable logic block (e.g., block 301). Similarly, a user control signal (e.g., $U_2$) having an activated state will cause the associated switching regulator (e.g., switching regulator 502) to provide a reduced voltage to the associated programmable logic block (e.g., block 502). A configuration data value (e.g., $C_3$) and an associated user control signal (e.g., $U_3$) both having have deactivated states will cause the associated switching regulator (e.g., switching regulator 503) to provide the full VDD supply voltage to the associated programmable logic block (e.g., block 503).

In accordance with one embodiment, configuration data values $C_1$-$C_4$ may be selected at design time, such that reduced voltages are subsequently applied to unused blocks during run time. User control signals $U_1$-$U_4$ may be selected during run time, such that reduced voltages are dynamically applied to inactive blocks at run time. Techniques for distributing multiple programmable down-converted voltages using on-chip switching voltage regulators are described in more detail in U.S. patent application Ser. No. 10/606,619, "Integrated Circuit with High-Voltage, Low-Current Power Supply Distribution and Methods of Using the Same" by Bernard J. New et al., which is hereby incorporated by reference in its entirety.

In the embodiment of FIG. 5, the granularity of the voltage scaled programmable logic blocks 301-304 should be fairly large because the overhead associated with switching regulators 501-504 is significant. In an FPGA, each programmable logic block 301-304 would most likely be divided into several clusters of configuration logic blocks (CLBs). The exact size of each programmable logic block is determined by the desired trade-off among power savings, layout area overhead of the switching regulators, and the speed penalty.

Figure 6:
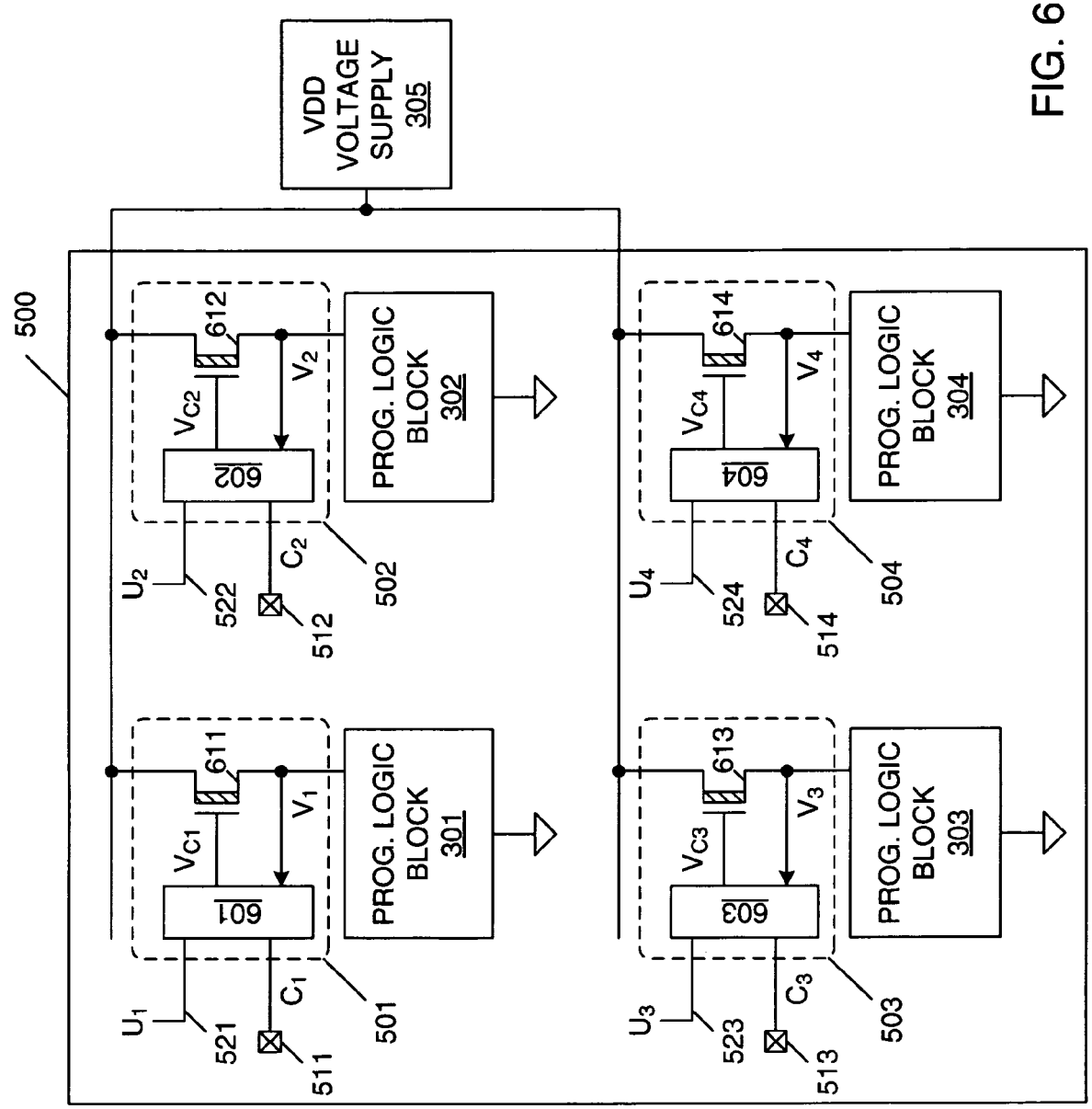
FIG. 6 is a block diagram of the PLD of FIG. 5, which shows switching regulators in accordance with one embodiment of the present invention.

FIG. 6 is a block diagram of PLD 500, which shows switching regulators 501-504 in accordance with one embodiment of the present invention. Switching regulators 501-504 include control blocks 601-604, respectively, and high-voltage n-channel transistors 611-614, respectively. High-voltage n-channel transistors 611-614 can tolerate high voltages and may have relatively thick gate dielectric layers (e.g., 50 to 60 Angstroms) and relatively wide channel regions. In some embodiments, the gate dielectric thickness of the high-voltage n-channel transistors 611-614 is approximately 4 to 6 times thicker than the gate dielectric thickness used in the programmable logic blocks 301-304. The drain of each of n-channel transistors 611-614 is coupled to the VDD voltage supply 305. The gates of n-channel transistors 611-614 are coupled to receive the control voltages $V_{C1}$-$V_{C4}$, respectively, from the corresponding control blocks 601-604. The sources of n-channel transistors 611-614 are configured to provide an operating voltage $V_1$-$V_4$, respectively, to programmable logic blocks 301-304, respectively. The source of each n-channel transistor 611-614 is also coupled to the corresponding control block 601-604 in a feedback configuration.

Each of n-channel transistors 611-614 forms a power switch between the VDD supply voltage 305 and the associated programmable logic block. Thick oxide n-channel transistors 611-614 are used to implement the power switches to ensure that a high voltage, herein referred to as $V_{BOOST}$, can be applied to the gates of n-channel transistors 611-614 when the associated programmable logic block is active. The high voltage $V_{BOOST}$ increases the drive current of n-channel transistors 611-614. In accordance with one embodiment, the high voltage $V_{BOOST}$ is about 2 to 2.5 times greater than VDD. When the high voltage $V_{BOOST}$ is applied to the gate of one of transistors 611-614, the corresponding operating voltage $V_1$-$V_4$ is pulled up to the full VDD supply voltage.

When a programmable logic block (e.g., programmable logic block 301) is inactive, the associated operating voltage (e.g., $V_1$) is reduced. The operating voltage applied to the associated programmable logic block is preferably selected to be high enough to retain data stored in this programmable logic block. In one embodiment, the operating voltage is reduced to a voltage that is about one half the VDD supply voltage. The operating voltage is reduced by applying a low voltage $V_{STANDBY}$ to the gate of the corresponding n-channel transistor (e.g., transistor 611). In one embodiment, the low voltage $V_{STANDBY}$ is about 80 to 100 percent of the VDD supply voltage.

In accordance with one embodiment, each of control blocks 601-604 is independently controlled to provide either the high voltage $V_{BOOST}$ or the low voltage $V_{STANDBY}$ to the associated n-channel transistor 611-614.

For example, control block 601 is configured to receive the user control signal $U_1$ and the configuration data value $C_1$, which have been described above. If both the user control signal $U_1$ and the configuration data value $C_1$ are deactivated, then control block 601 provides a control voltage $V_{C1}$ equal to the high voltage $V_{BOOST}$ to the gate of n-channel transistor 611. As a result, an operating voltage $V_1$ equal to the VDD supply voltage is applied to programmable logic block 301.

However, if either user control signal $U_1$ or configuration data value $C_1$ is activated, then control block 601 provides a control voltage $V_{C1}$ equal to the low voltage $V_{STANDBY}$ to the gate of n-channel transistor 611. As a result, an operating voltage $V_1$ approximately equal to one half the VDD supply voltage is applied to programmable logic block 301.

To ensure that the operating voltage $V_1$ applied to programmable logic block 301 has a value of ½ VDD when the $V_{STANDBY}$ voltage is applied to the gate of transistor 611, the control block 601 may include a feedback mechanism that adjusts the low voltage $V_{STANDBY}$ signal until the operating voltage $V_1$ is precisely equal to ½ VDD, or any other desired voltage.

It is well known that the gate current through a transistor typically increases by an order of magnitude for every 0.3 Volt increase in the VDD supply voltage. It is therefore expected that reducing the operating voltage of a programmable logic block by half (½ VDD) will reduce the gate current through the transistors present in the programmable logic block by an order of magnitude or more. At the same time, the sub-threshold leakage of these transistors will also decrease with the reduced operating voltage. Based on earlier generation technology, the leakage current may be reduced by 70% or more when reducing the operating voltage to ½ VDD. Simulation of a ring oscillator shows that the ring oscillator will operate properly at the lower operating voltage (½ VDD). It can be expected the associated logic block will retain stored data using the lower operating voltage. Therefore, the proposed switching regulators are capable of achieving more than 70% reduction in leakage current without a significant increase in area penalty and without sacrificing desired functionality.

The above-described embodiments may reduce the static power consumption of a PLD's programmable logic blocks in response to control signals generated during design time by disabling programmable logic blocks that are not used by a particular user design. Further, user control signals may be generated during run time to dynamically disable individual programmable logic blocks in response to certain observable operating conditions, for example, to reduce the static power consumption of programmable logic blocks that are inactive for a selected time period. For some embodiments, the user control signals may be generated on-chip in response to observed operating conditions.

Figure 7:
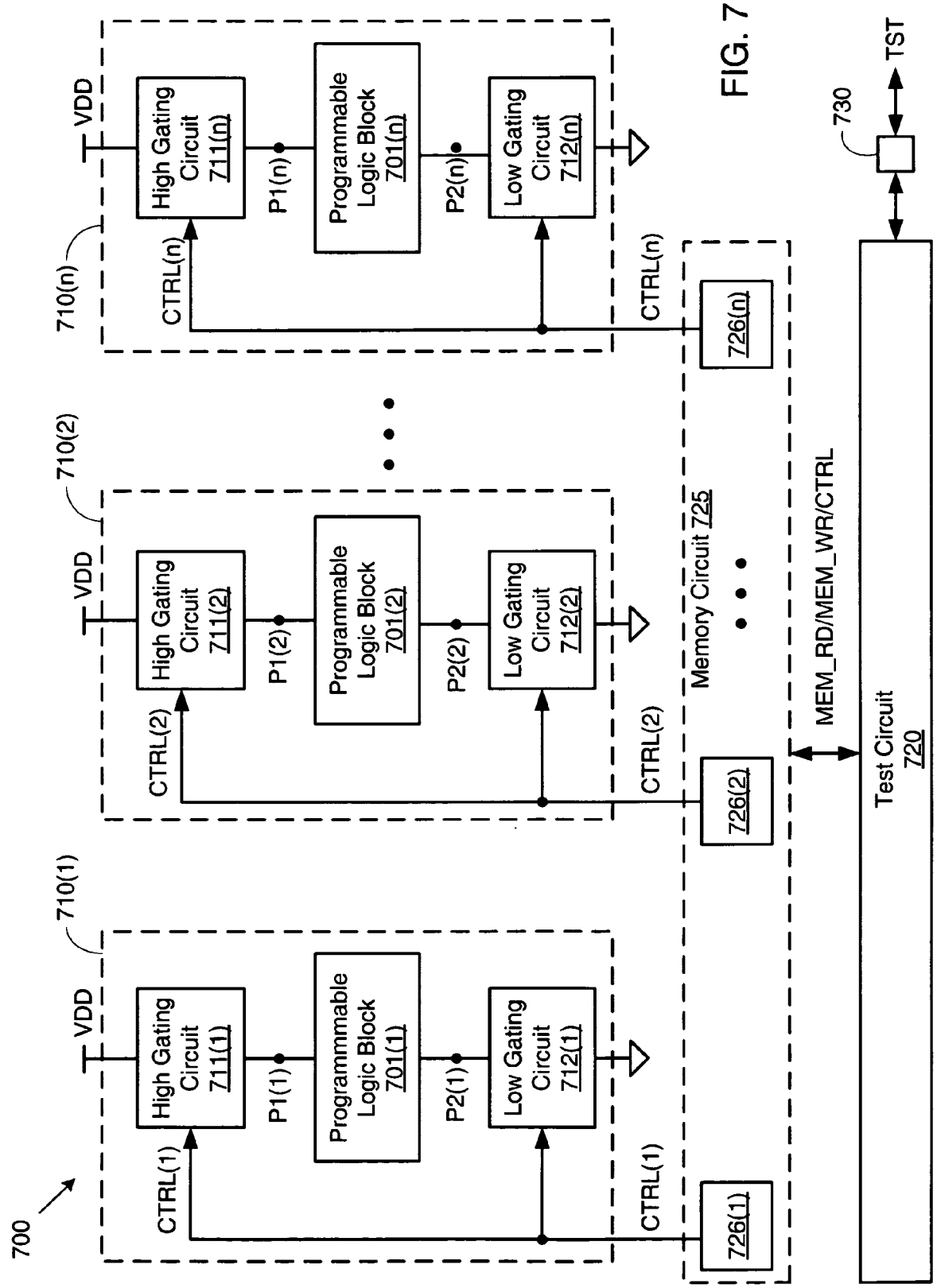
FIG. 7 is a block diagram of a PLD including a test circuit coupled to a number of gating circuits that selectively adjust the operating voltage provided to corresponding programmable logic blocks in accordance with some embodiments of the present invention.

For other embodiments, the user control signals may be generated external to the PLD (e.g., in response to observed operating conditions) and provided to the PLD via existing test pins so that none of the PLD's I/O pins are required to receive the externally-generated control signals, thereby allowing all of the PLD's non-test pins to be used for implementing a desired user design. For example, FIG. 7 shows a PLD 700 in accordance with some embodiments of the present invention. PLD 700 includes a plurality of programmable logic blocks 701(1)-701(n), a power rail to provide the supply voltage VDD, a plurality of high gating circuits 711(1)-711(n), a plurality of low gating circuits 712(1)-712(n), a test circuit 720, a memory circuit 725, and a test I/O pin set 730. Together, each programmable logic block 701, a corresponding high gating circuit 711, and a corresponding low gating circuit 712 form an independently controllable power-gated portion 710 of the PLD 700.

Each programmable logic block 701 includes a first power terminal coupled to a corresponding first power node P1, and includes a second power terminal coupled to a corresponding second power node P2. Programmable logic blocks 701 may include any number of PLD resources such as configurable logic blocks, I/O blocks, configuration memory cells, embedded block RAM, embedded processors, and so on. For some embodiments, programmable logic blocks 701 of FIG. 7 may be programmable logic blocks 301-304 of FIG. 4. As mentioned above, the granularity of the programmable logic blocks can range from arbitrarily small circuits to significant portions of the PLD. For example, for one embodiment, programmable logic block 701(1) may include a single CLB, while for another embodiment programmable logic block 701(1) may include a plurality of CLBs, IOBs, embedded memory elements, and/or other suitable circuitry. Further, the sizes of each of programmable logic blocks 701(1)-701(n) of FIG. 7 may be different from one another. The size of each programmable logic block 701 may be selected either at chip design time (e.g., when developing the PLD itself), user design time (e.g., when constructing configuration data for the PLD) or at run time (e.g., by re-configuring the PLD). Thus, for some embodiments, one or more of the programmable logic blocks may be allocated at design time to include resources that will not be utilized by the user design so that during subsequent PLD operation programmable logic blocks that contain such unused resources may be disabled to reduce power consumption.

Each high gating circuit 711 is coupled between VDD and a corresponding power node P1, and includes a control terminal to receive a corresponding power-gating control signal CTRL from memory circuit 725. For some embodiments, control signals CTRL of FIG. 7 may be control signals SLEEP of FIG. 4. Each low gating circuit 712 is coupled between ground potential and a corresponding power node P2, and includes a control terminal to receive the corresponding control signal CTRL. For example, high gating circuit 711(1) is coupled between VDD and power node P1(1) of programmable logic block 701(1) and is responsive to CTRL(1), and low gating circuit 712(1) is coupled between ground potential and power node P2(1) of programmable logic block 701(1) and is responsive to CTRL(1). For some embodiments, gating circuits 711-712 may reside on the same chip as programmable logic blocks 701, as depicted in the exemplary embodiment of FIG. 7. For other embodiments, gating circuits 711-712 may be located external to the chip containing programmable logic blocks 701.

Gating circuits 711-712 may be independently controlled to selectively and dynamically adjust the operating voltage provided to individual programmable logic blocks 701 in response to corresponding control signals CTRL. Thus, each gating circuit pair 711-712 may provide a full operating voltage to its associated programmable logic block 701 when the corresponding CTRL signal is driven to a first state, thereby enabling the programmable logic block 701 for normal operation, and each gating circuit pair 711-712 may provide a negligible operating voltage to its associated programmable logic block 701 when the corresponding CTRL signal is driven to a second state, thereby disabling the programmable logic block 701 to minimize static power consumption. Further, for some embodiments, each gating circuit pair 711-712 may provide a reduced operating voltage to its associated programmable logic block 701 when the corresponding CTRL signal is driven to a third state, thereby dynamically reducing static power consumption of the programmable logic block 701 while retaining data stored therein.

Gating circuits 711-712 may be any suitable power-gating circuit. For some embodiments, each gating circuit 711-712 may be a power transistor having a gate to receive the corresponding control signal CTRL, for example, as described above with respect to switch elements 401-408 of FIG. 4. For other embodiments, each gating circuit 711-712 may be a switching regulator having a control terminal to receive the corresponding control signal CTRL, for example, as described above with respect to switching regulators 501-504 of FIG. 5 and/or FIG. 6. For one embodiment, each gating circuit pair 711-712 may be configured to adjust the operating voltage provided to the corresponding programmable logic block 701 by selectively adjusting the current flow from VDD to the programmable logic block 701 in response to the corresponding control signal CTRL. For another embodiment, each gating circuit pair 711-712 may be configured to adjust the operating voltage provided to the corresponding programmable logic block 701 by selectively providing a diode voltage drop between VDD and power node P1 and/or by selectively providing a diode voltage drop between power node P2 and ground potential in response to the corresponding control signal CTRL.

For other embodiments, low gating circuits 712 may be eliminated, with the second power terminal of each programmable logic block 701 coupled directly to ground potential, thereby reducing circuit area. For yet other embodiments, high gating circuits 711 may be eliminated, with the first power terminal of each programmable logic block 701 coupled directly to VDD, thereby reducing circuit area.

Memory circuit 725, which includes a first port coupled to test circuit 720 and includes second ports coupled to corresponding power-gated PLD portions 710, includes a plurality of storage elements 726(1)-726(n) to store corresponding control signals CTRL(1)-CTRL(n) for power-gated PLD portions 710(1)-710(n), respectively. Memory circuit 725 may be implemented using any suitable memory architecture, and may include any suitable type of storage elements (e.g., memory cells, latches, registers, fuses, and the like). For some embodiments, memory circuit 725 may be a volatile memory such as DRAM, SRAM, or a register circuit. For other embodiments, memory circuit 725 may be a non-volatile semiconductor memory such as EEPROM, EPROM, PROM, or flash memory circuit. For still other embodiments, memory circuit 725 may be a fuse bank. For yet other embodiments, memory circuit 725 may be eliminated, and test circuit 720 may be coupled directly to power-gated PLD portions 710.

Test circuit 720 may control access to and operation of memory circuit 725 using suitable memory read signals MEM_RD and memory write signals MEM_WR, which in turn may be extracted from and/or generated in response to an externally-generated test signal set TST. For some embodiments, the test signal set TST may also include suitable values for the power-gating control signals CTRL(1)-CTRL(n), and may also include instructions that allow test circuit 720 to access memory circuit 725 and/or route the CTRL signals from memory circuit 725 to power-gated PLD portions 710. For example, in response to a suitable test instruction, test circuit 720 may use MEM_WR to write suitable values of CTRL(1)-CTRL(n) into memory circuit 725, and may use MEM_RD to read values of CTRL(1)-CTRL(n) from memory circuit 725 for routing CTRL(1)-CTRL(n) to power-gated PLD portions 710(1)-710(n), respectively, thereby dynamically and selectively adjusting the operating voltage provided to individual programmable logic blocks 701 during run time.

Figure 8:
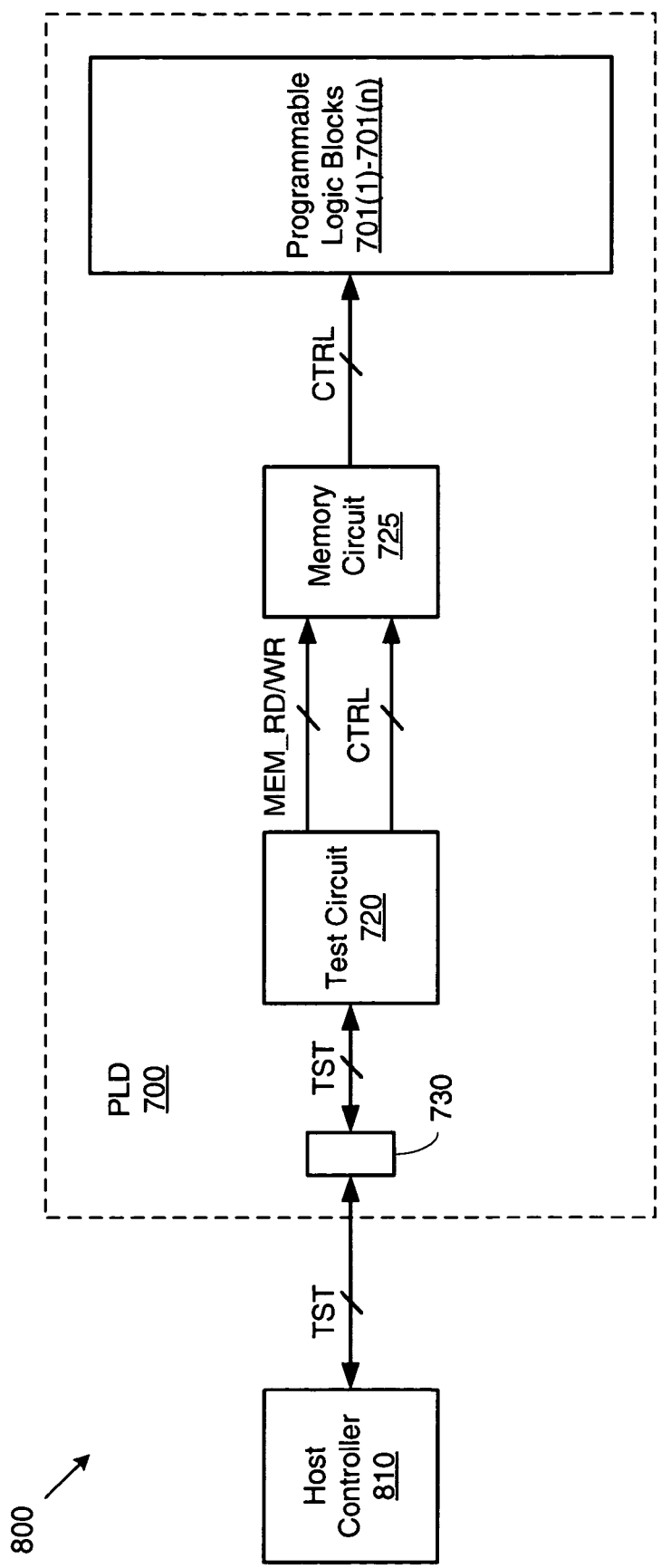
FIG. 8 is a block diagram of a system including the PLD of FIG. 7 coupled to an external controller in accordance with some embodiments of the present invention.

Referring also to FIG. 8, which shows a system 800 including PLD 700 coupled to an external controller 810 via test pin set 730, test circuit 720 is coupled to memory circuit 725 and is coupled to external controller 810 via test pin set 730. Controller 810, which can be any suitable circuit, device, or system capable of communicating with test circuit 720 via test pin set 730, may generate the test signals TST in any suitable manner. For some embodiments, controller 810 may generate the test signals in response to observed operating conditions during run time of PLD 700, for example, so that the operating voltage provided to inactive programmable logic blocks 701 may be dynamically adjusted (e.g., reduced) to minimize static power consumption. For one embodiment, controller 810 may monitor activity on one or more of the PLD's non-test I/O pins (not shown for simplicity) to determine which (if any) of programmable logic blocks 701 have been inactive for a selected time period, and in response thereto generate values of CTRL(1)-CTRL(n) that result in disabling or reducing the operating voltage provided to the inactive programmable logic blocks while providing the full operating voltage to the active programmable logic blocks. For another embodiment, test circuit 720 may monitor the PLD's non-test I/O pins to observe the operating conditions of PLD 700, and the resulting activity information may be used by test circuit 720 and/or by external controller 810 to generate suitable values for the CTRL signals. For another embodiment, controller 810 may generate the CTRL signals in response to other data indicating which (if any) of the programmable logic blocks 701 are inactive. For other embodiments, controller 810 may generate the CTRL signals in response to a predetermined power profile associated with the user design to be implemented in the PLD, and may provide such CTRL signals to the PLD during configuration of the PLD and/or during normal operation (i.e., during run time) of the PLD.

Figure 9A:
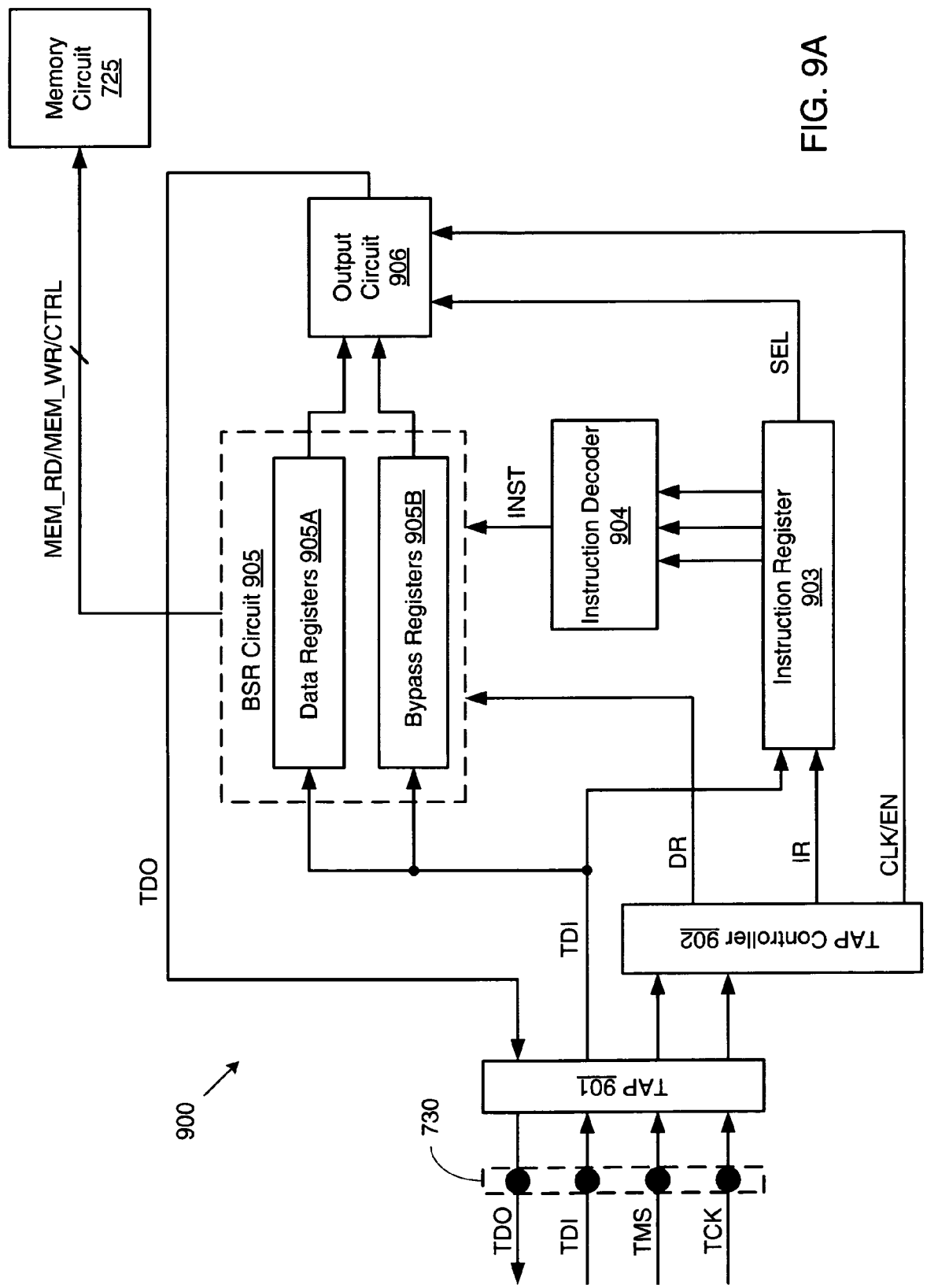
FIG. 9A is a functional block diagram of one embodiment of the test circuit of FIG. 7.

Test circuit 720 may be any suitable test circuit capable of providing control signals CTRL to power-gated PLD portions 710 via memory circuit 725 in response to the test signal set TST provided by external controller 810. For some embodiments, test circuit 720 is a well-known test circuit that complies with IEEE standard 1149.1, which is commonly referred to as the JTAG standard. For example, FIG. 9A is a functional block diagram of a well-known JTAG-compliant test circuit 900 that is one embodiment of test circuit 720 of FIGS. 7-8. JTAG circuit 900 includes a test access port (TAP) 901, a TAP controller 902, an instruction register 903, an instruction decoder 904, a boundary scan register (BSR) circuit 905 having one or more test data registers 905A and one or more bypass registers 905B, and an output circuit 906. The various components of JTAG circuit 900 operate according to well-known JTAG protocols. TAP 901 provides access to the test support functions built into an IEEE Standard 1149.1 compliant PLD. TAP 901 includes three input connections for receiving the test clock input (TCK) signal, the test mode select (TMS) signal, and the test data input (TDI) signal via three corresponding test pins 730. The TMS signal is used to control the state of TAP controller 902, as discussed below. The TDI signal is used for serial transmission of data or instruction bits, depending upon the state of TAP controller 902. TAP 901 also includes an output connection through which the test data out (TDO) signals are transmitted via a fourth corresponding test pin 730. Depending upon the state of TAP controller 902, the TDO signal is used to serially shift either instruction register or data register contents out of JTAG circuit 900. Further, in accordance with embodiments of the present invention, individual storage locations within test data registers 905A may be coupled to corresponding storage elements 726 in memory circuit 725. For simplicity, the connections between individual storage locations within test data registers 905A and corresponding storage elements 726 in memory circuit 725 are not shown in detail in FIG. 9A. As explained in more detail below, test data register(s) 905A may be used to route the CTRL signals extracted or derived from an externally-generated test signal set TST from test pins 730 to memory circuit 725. For some embodiments, the boundary scan architecture of test circuit 900 may be used to route the CTRL signals from memory circuit 725 to corresponding power-gated PLD portions 710. For other embodiments, the CTRL signals read from memory circuit 725 in response to MEM_RD may be routed to power-gated PLD portions 710 using dedicated signal lines, for example, as depicted in FIG. 7.

Figure 9B:
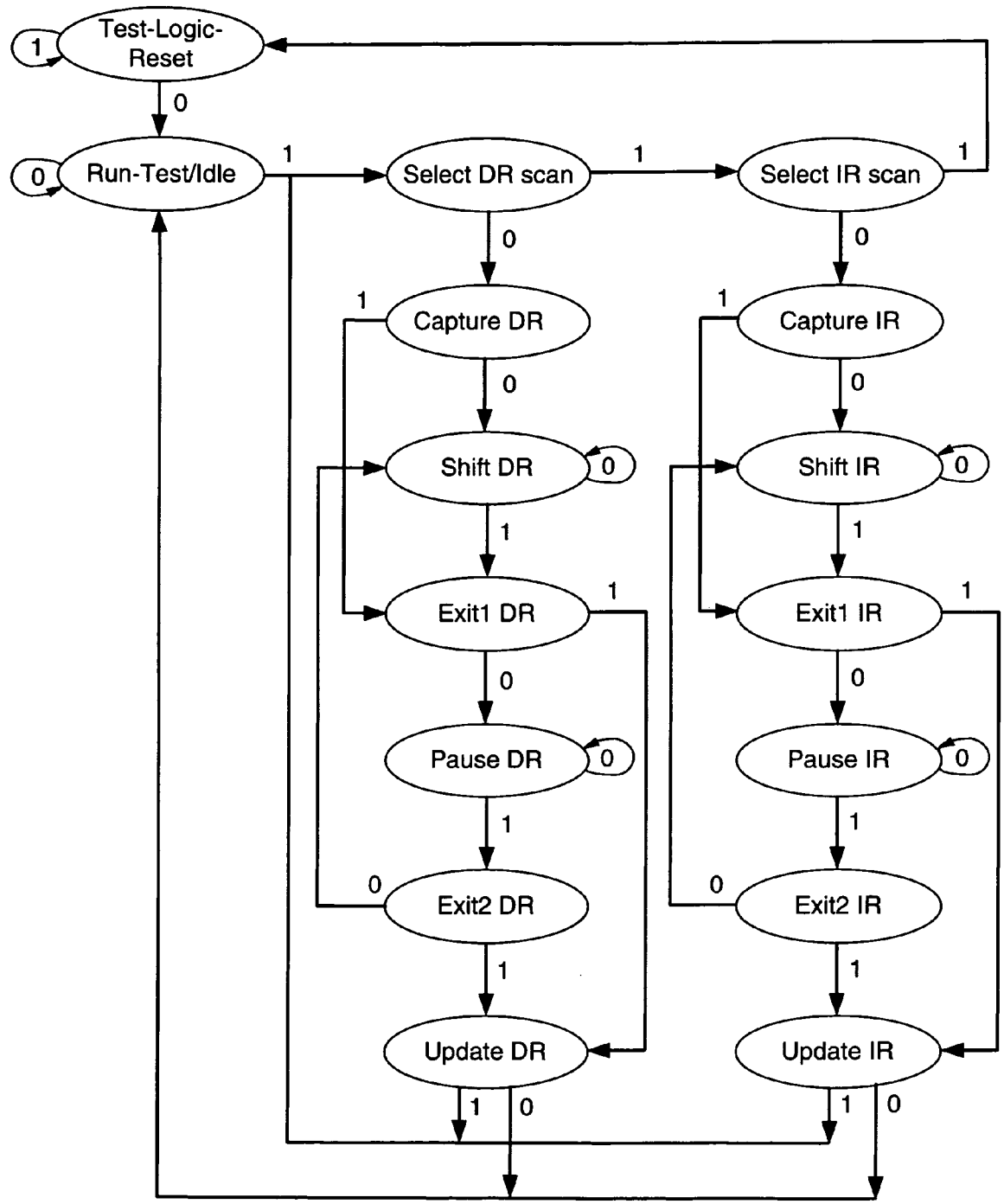
FIG. 9B is state diagram illustrating operation of the TAP controller of the JTAG test circuit of FIG. 9A.

FIG. 9B is a state diagram for explaining the operation of TAP controller 902 of FIG. 9A. The basic function of TAP controller 902 is to generate clock and control signals required for the correct sequence of operations of instruction register 903, BSR circuit 905, and output circuit 906. Specifically, TAP controller 902 controls signals that facilitate loading of instructions into instruction register 903, shifting TDI data into and TDO data out of data register 905A, and performing test actions such as capture, shift and update test data. These signals are provided in accordance with the state of TAP controller 902. All state transitions (indicated as arrows in FIG. 9B) within TAP controller 902 occur in accordance with the serially received TMS values (shown next to each arrow). As known in the art, TAP controller 902 can be used to configure various resources within programmable logic blocks 701 to desired states via the boundary-scan circuit 905, and can also be used to access and/or control the internal resources of programmable logic blocks 701.

In operation, TAP controller 902 is initialized to the Test-Logic Reset state. From Test-Logic Reset state, TAP controller 902 enters the Run-Test/Idle state when TMS is held low (logic 0) for at least one TCK pulse. TAP controller 902 is placed in this state while, for example, program, erase, blank and verify operations are performed on various memory cells of programmable logic blocks 701 of PLD 700 (see also FIG. 7), and remains in this state until TMS is held high. During test procedures, TAP controller 902 either enters a data register (DR) branch of the state machine, or an instruction register (IR) branch of the state machine.

When TAP controller 902 enters the DR branch of the state diagram, either a selected data register (or serially connected set of registers) of BSR circuit 905 is connected between TDI and TDO. The Capture-DR state is used to load data from, for example, the TDI pin of the PLD. The Shift-DR state is used to shift previously captured data toward the TDO connector such that the data is shifted by one serially connected register 905A per TCK pulse. The Exit1-DR state, Pause-DR state, and Exit2-DR state are provided to switch between selected states and to temporarily halt a shifting process to allow, for example, synchronization between TCK and system clock signals, when needed. TAP controller 902 remains in the Pause-DR state until TMS is held high, at which time it enters the Exit2-DR state. From the Exit2-DR state, TAP controller 902 either returns to the Shift-DR state, or enters the Update-DR state. Once TAP controller 902 is in the Update-DR state, data shifting to/between the selected register(s) is completed, and the data stored in the selected register(s) is passed, for example, to the TDO pin of PLD 700. From the Update-DR state, TAP controller 902 either returns to the Run-Test/Idle state (i.e., when TMS is held low) or to the Select-DR state (i.e., when TMS is held high).

The IR branch of the state machine is used to load instructions into the boundary scan architecture. As shown in FIG. 9B, the states of the IR branch are similar to the states of the DR branch, and therefore are not discussed in further detail.

Figure 10B:
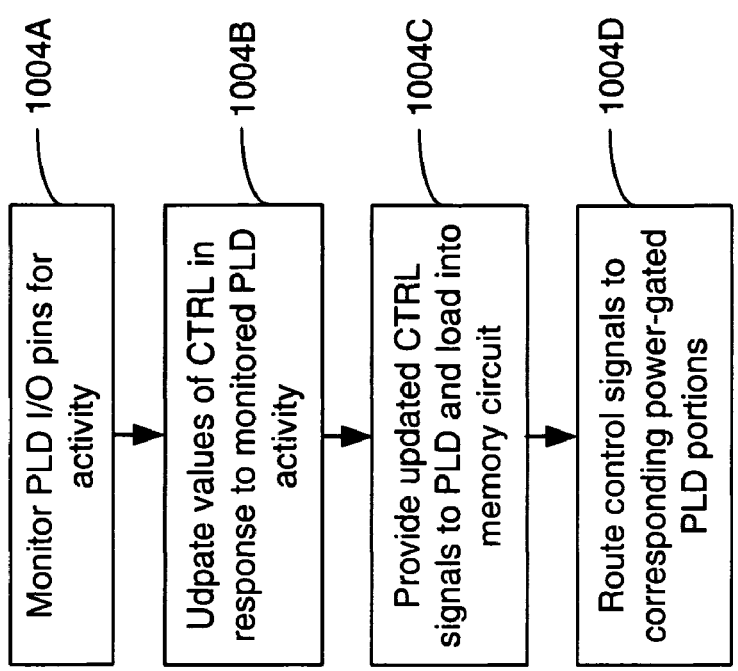
FIG. 10B is an illustrative flow chart depicting an exemplary embodiment for monitoring activity of the PLD of FIG. 7.
Figure 10A:
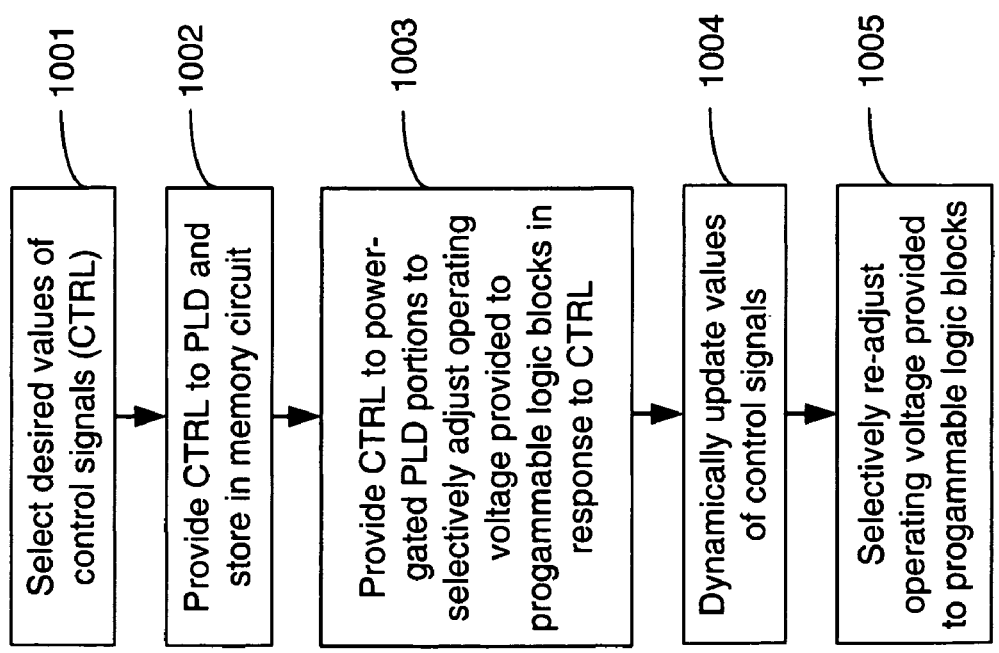
FIG. 10A is an illustrative flow chart depicting an exemplary embodiment for providing and updating control signals to the PLD of FIG. 7.

An exemplary operation of an illustrative embodiment of PLD 700 for dynamically adjusting the operating voltage provided to portions 710 of PLD 700 is described below with respect to the flow charts of FIGS. 10A and 10B, as well as with respect to FIGS. 7, 8, 9A, and 9B. Initially, suitable values for the control signals CTRL(1)-CTRL(n) are selected that will independently provide a desired operating voltage to each of the programmable logic blocks 701 (step 1001). For some embodiments, the initial values of the control signals may be selected at design time according to which programmable logic blocks will be used by the user design and which programmable logic blocks will not be used by the user design. Thus, for example, the initial values of the control signals may subsequently cause resources utilized by the user design to be enabled for normal operation and cause resources not utilized by the user design to be disabled.

The control signals are then provided to the PLD and stored in corresponding storage elements 726 of memory circuit 725 (step 1002). For some embodiments, the control signals may be provided to the PLD during configuration operations, for example, as part of a configuration bitstream containing a user design to be implemented by the PLD, and thereafter loaded into storage elements 726 in a well-known manner. For such embodiments, storage elements 726 may be well-known PLD configuration memory cells. For other embodiments, the control signals may be provided to the PLD's JTAG test circuit from external controller 810 via test pins 730, and thereafter loaded into corresponding storage elements 726 of memory circuit 725 using the test circuit's boundary scan architecture.

During operation of PLD 700, the control signals stored in memory circuit 725 may be provided to corresponding power-gated PLD portions 710 in any suitable manner to selectively adjust the operating voltage provided to their associated programmable logic blocks 701 (step 1003). For some embodiments, memory circuit 725 may be configured to output the control signals to corresponding power-gated PLD portions 710 upon power-up (e.g., configuration) of the PLD. For other embodiments, the boundary scan architecture of JTAG circuit 900 may be used to access memory circuit 725 and to route the control signals to corresponding power-gated PLD portions 710 using well-known JTAG command sequences, as explained in more detail below. Once received by power-gated PLD portions 710, the control signals CTRL may be used to independently control gating circuit pairs 711-712 to selectively adjust the operating voltage provided to programmable logic blocks 701, as described above.

Thereafter, JTAG circuit 900 may be used to dynamically update the values of the control signals stored in memory circuit 725 during normal PLD operation, for example, to selectively adjust the operating voltage provided to individual programmable logic blocks 701 in response to observed operating conditions of the PLD (step 1004). Referring also to FIG. 10B, for some embodiments, any number of the PLD's non-test I/O pins (not shown for simplicity) may be monitored for activity, for example, to determine whether any of the programmable logic blocks 701 have been inactive for a selected period of time (step 1004A). For example, for one embodiment, the JTAG circuit's boundary scan architecture may be used to monitor activity on the PLD's non-test I/O pins using the well-known boundary scan instruction SAMPLE. For another embodiment, the PLD's activity may be monitored by directly sampling the non-test I/O pins, for example, using controller 810 and/or another circuit (not shown for simplicity) coupled to controller 810.

The control signals CTRL(1)-CTRL(n) are then selectively updated according to the activity information generated in response to the observed operating conditions of the PLD (step 1004B). For some embodiments, the CTRL signals are updated by external controller 810 in response to activity information gathered by monitoring the PLD's non-test pins, as described above. For other embodiments, the CTRL signals may be updated by suitable logic (not shown for simplicity) provided within the PLD.

Then, the updated control signals are provided to the PLD and loaded into memory circuit 725 during normal operation of the PLD using the PLD's test circuit (step 1004C). For some embodiments, the updated control signals are provided from external controller 810 to the PLD via test pins 730, and thereafter loaded into corresponding storage elements 726 of memory circuit 725 using the JTAG test circuit's boundary scan architecture. For example, test data (e.g., TST) including the updated control signals CTRL, the memory control signals MEM_RD and MEM_WR and associated instructions for controlling operation of the boundary scan architecture may be clocked as a serial bitstream (TDI) into JTAG circuit 900 under control of the TMS and TCK signals. More specifically, a suitable JTAG instruction (IR) may be shifted into instruction register 903 from controller 810 via test pins 730 and TAP 901 when TAP controller 902 is in the Shift-IR state.

The instruction is decoded by instruction decoder 904, which then generates one or more corresponding instruction signals INST (e.g., MEM_WR and MEM_RD) that are transmitted to test data register 905A of BSR circuit 905. Then, TAP controller 902 transitions to the RUN-TEST state, serially shifts the CTRL signals from controller 810 into test data register 905A via the TDI pin, and provides the CTRL signals as input signals to memory circuit 725. The MEM_WR signal initiates a write operation during which the updated control signals CTRL are stored in corresponding storage elements 726 of memory circuit 725.

Then, the updated control signals are routed from memory circuit 725 to power-gated PLD portions 710 (step 1004D). For example, JTAG circuit 900 may initiate a read instruction (e.g., using MEM_RD) to memory circuit 725 that causes memory circuit 725 to read the updated control signals CTRL from corresponding storage elements 726 of memory circuit 725. Thereafter, the updated control signals CTRL are provided to power-gated PLD portions 710. For some embodiments, the test circuit's boundary scan architecture may be used to route the updated control signals CTRL to power-gated PLD portions 710. For other embodiments, the updated control signals CTRL may be routed to power-gated PLD portions 710 via direct signal line connections.

Referring again to FIG. 10A, once received by power-gated PLD portions 710, the updated control signals may be used to selectively re-adjust the operating voltage provided to individual programmable logic blocks 701, for example, in response to the observed operating conditions (step 1005). Accordingly, the operating voltage provided to those power-gated PLD portions 710 which are inactive for a selected time period may be subsequently adjusted (e.g., to either a reduced operating voltage or to a negligible operating voltage) during run time in response to the updated control signals while maintaining the full operating voltage for those power-gated PLD portions 710 which remain active. Further, because the updated control signals are provided to the PLD via its test pins 730, the operating voltage provided to the PLD's programmable logic blocks 701 may be dynamically and independently adjusted in response to the updated control signals without using the PLD's non-test I/O pins, which in turn may be used to implement the user design in the PLD. In this manner, embodiments of the present invention allow the operating voltage of various programmable logic blocks to be independently adjusted (e.g., reduced or effectively eliminated) during run time in response to externally generated signals without sacrificing the I/O capability of the PLD.

The JTAG circuit 900 may also be used to read the control signals from memory circuit 725 for output from PLD 700 as a TDO bitstream, which may then be provided to one or more external circuits or systems such as controller 810 for analysis and/or other purposes.

Figure 11:
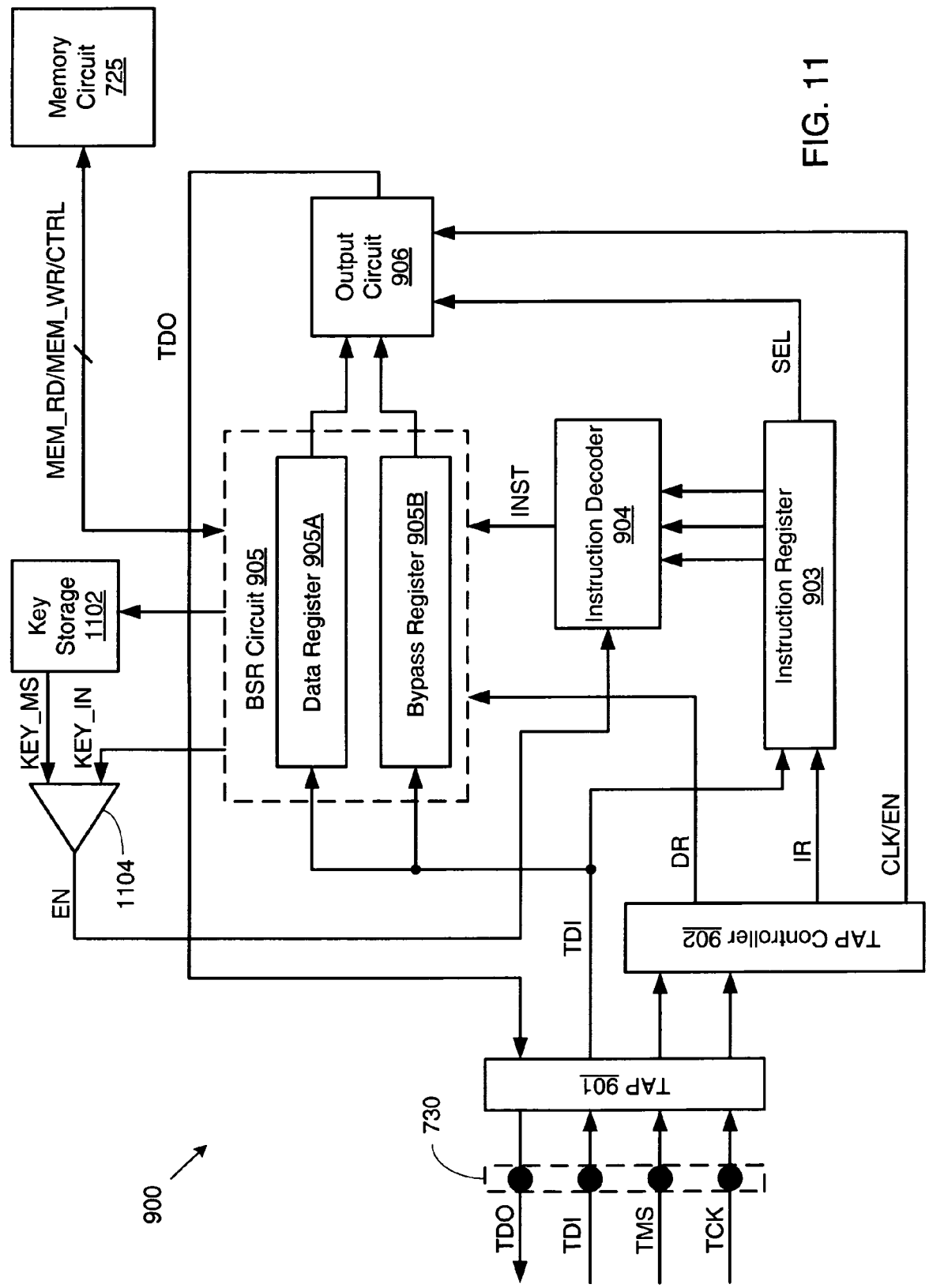
FIG. 11 is a functional block diagram of the test circuit of FIG. 9A for implementing a security feature.

Further, for some embodiments, access to data stored in memory circuit 725 via the boundary scan architecture of test circuit 720/900 may be protected by a password or key. For example, FIG. 11 shows a functional diagram of an exemplary embodiment capable of selectively allowing JTAG circuit 900 to access memory circuit 725 in response to an input key (KEY_IN). For such embodiments, a master key (KEY_MS) may be stored in a key storage element 1102, which may be any suitable type of memory element. For some embodiments, KEY_MS may be part of the configuration bitstream and stored in key storage element 1102 during configuration of the PLD. For such embodiments, key storage element 1102 may be a configuration memory cell. For other embodiments, KEY_MS may be stored in key storage element 1102 using the test circuit's boundary scan architecture. Key storage element 1102 has an output coupled to a first input of a well-known comparator 1104, and includes an input/control terminal coupled to BSR circuit 905. Comparator 1104 includes a second input coupled to BSR circuit 905, and includes an output to provide an enable signal EN to instruction decoder 904.

During operation of the PLD, a load/access instruction may be provided from external controller 810 to test circuit 900, which in response thereto loads KEY_IN provided from controller 810 into one of the data registers 905A and causes comparator 1104 to compare KEY_IN with KEY_MS. For some embodiments, the load/access instruction may cause KEY_MS to be read from key storage element 1102 to comparator 1104. If there is a match between KEY_IN and KEY_MS, comparator 1104 asserts EN to a first state that causes instruction decoder 904 to validate a corresponding access instruction for accessing memory circuit 725. Conversely, if there is not a match, comparator 1104 de-asserts EN to a second state that causes instruction decoder 904 to invalidate the corresponding access instruction, thereby preventing test circuit 900 from accessing memory circuit 725 and therefore preventing test circuit 900 from reading the CTRL signals from memory circuit 725. Accordingly, without the proper input key KEY_IN, the test circuit's boundary scan architecture cannot be used to read the CTRL signals from memory circuit 725, and thus cannot be used to alter the operating voltage provided to the PLD's programmable logic blocks 701. In this manner, the embodiment of FIG. 11 prevents an unauthorized user from maliciously disabling the various resources of PLD 700.

As described above, the operating voltage provided to each of programmable logic blocks 701(1)-701(n) may be independently adjusted by corresponding gating circuit pairs 711-712 in response to control signals CTRL.

However, for other embodiments, conserving the silicon area occupied by the PLD may be a more important consideration than the ability to independently control the operating voltage provided to each of programmable logic blocks 701(1)-701(n). For example, for another embodiment, the first power terminals of programmable logic blocks 701(1)-701(n) may be coupled to the same first power node P1, and the second power terminals of programmable logic blocks 701(1)-701(n) may be coupled to the same second power node P2. For this embodiment, a single high gating circuit 711 coupled between power node P1 and VDD and a single low gating circuit 712 coupled between power node P2 and ground potential may be used to selectively adjust the operating voltage provided to programmable logic blocks 701(1)-701(n).

Although the invention has been described in connection with several embodiments, it is understood that this invention is not limited to the embodiments disclosed, but is capable of various modifications, which would be apparent to a person skilled in the art.

What is claimed is:

1. A system including an integrated circuit (IC) device, the IC device comprising:
   a power rail to provide a supply voltage;
   a plurality of logic blocks;
   a plurality of gating circuits, each coupled between the power rail and a power terminal of a corresponding logic block and having a control terminal to receive a corresponding control signal, wherein the gating circuits are configured to selectively adjust an operating voltage provided to the logic blocks in response to the control signals;
   a memory circuit for storing the control signals;

a test pin set to receive a test signal set comprising the control signals; and a test circuit including a boundary scan register coupled to the test pin set and coupled to the memory circuit, wherein the test circuit is configured to write the control signals received from the test pin set into the memory circuit, wherein the test pin set does not receive data signals used to program the plurality of logic blocks.

2. The system of claim 1, wherein:

asserting one of the control signals to a first state causes the corresponding gating circuit to provide the supply voltage to the power terminal of the corresponding logic block; and asserting the one of the control signals to a second state causes the corresponding gating circuit to provide a reduced supply voltage to the power terminal of the corresponding logic block.

3. The system of claim 2, wherein asserting the one of the control signals to a third state causes the corresponding gating circuit to provide a negligible supply voltage to the power terminal of the corresponding logic block.

4. The system of claim 1, wherein the test pin set and the test circuit are part of a JTAG-compliant test architecture.

5. The system of claim 1, wherein the test circuit is further configured to read the control signals from the memory circuit in response to an instruction provided in the test signal set.

6. The system of claim 1, wherein the test circuit is further configured to monitor one or more I/O pins of the IC device to determine if any of the logic blocks are inactive for a selected time period.

7. The system of claim 1, wherein the test circuit is further configured to selectively access the memory circuit in response to an input key provided to the IC device via the test pin set.

8. The system of claim 1, further comprising:

an external controller coupled to the test pin set, the external controller configured to generate the control signals in response to an observed operating condition of the IC device.

9. A system including an integrated circuit (IC) device, the IC device comprising:

a power rail to provide a supply voltage;

a plurality of logic blocks;

a plurality of gating circuits, each coupled between the power rail and a power terminal of a corresponding logic block and having a control terminal to receive a corresponding control signal, wherein the gating circuits are configured to selectively adjust an operating voltage provided to the logic blocks in response to the control signals;

a dedicated test pin set to receive an externally-generated test signal set during a normal operation of the IC device, the test signal set comprising the control signals; and test means for providing the control signals from the test pin set to the gating circuits, wherein the test pin set does not receive data signals used to program the plurality of logic blocks.

10. The system of claim 9, wherein the test means is configured to monitor one or more I/O pins of the IC device for activity to determine if any of the logic blocks are inactive for a selected time period.

11. The system of claim 9, further comprising:

an external controller coupled to the test pin set, the external controller configured to generate the control signals in response to an observed operating condition of the IC device.

12. A method of controlling an operating voltage provided to a plurality of logic blocks of an integrated circuit (IC) device, the method comprising:

generating a number of first control signals external to the IC device;

providing the first control signals to the IC device via a dedicated test pin set;

storing the first control signals in a memory circuit in the IC device;

routing the first control signals to the logic blocks using a test circuit that includes a boundary scan register; and selectively adjusting, using a plurality of gating circuits, the operating voltage provided to the logic blocks in response to the first control signals, wherein each of the plurality of gating circuits is coupled to a power rail and has a control terminal to receive the first control signal, and wherein the test pin set does not receive data signals used to program the plurality of logic blocks.

13. The method of claim 12, wherein the test pin set and the test circuit are part of a JTAG-compliant test architecture.

14. The method of claim 12, wherein the first control signals are provided to the IC device during a configuration operation of the IC device.

15. The method of claim 12, wherein the first control signals are provided to the IC device during a normal operation of the IC device.

16. The method of claim 12, further comprising:

monitoring one or more I/O pins of the IC device for activity;

determining which logic blocks are inactive for a selected time period in response to the monitoring;

generating a number of second control signals in response to the determining;

updating the first control signals with the second control signals; and selectively re-adjusting the operating voltage provided to the logic blocks in response to the second control signals.

17. The method of claim 16, wherein the updating comprises:

providing the second control signals to the IC device via the dedicated test pin set during a normal operation of the IC device; and routing the second control signals to the logic blocks using the test circuit.

18. The method of claim 12, further comprising:

providing an input key to the test circuit via the dedicated test pin set;

comparing the input key to a master key stored in the IC device; and selectively disabling the test circuit in response to the comparing.

* * * * *